(12) United States Patent
Ogawa et al.

(10) Patent No.: US 7,463,941 B2
(45) Date of Patent: Dec. 9, 2008

(54) QUALITY CONTROL SYSTEM, QUALITY CONTROL METHOD, AND METHOD OF LOT-TO-LOT WAFER PROCESSING

(75) Inventors: Akira Ogawa, Kanagawa-ken (JP); Yukihiro Ushiku, Kanagawa-ken (JP); Tomomi Ino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 11/395,276

(22) Filed: Apr. 3, 2006

(65) Prior Publication Data
US 2006/0235560 A1 Oct. 19, 2006

(30) Foreign Application Priority Data
Apr. 5, 2005 (JP) ............... 2005-109209

(51) Int. Cl.
*G06F 19/00* (2006.01)
*G05B 19/418* (2006.01)
(52) U.S. Cl. .................... 700/109; 700/121; 702/83
(58) Field of Classification Search ........... 700/121, 700/109, 108, 110, 97; 716/4; 382/145; 702/81, 83
See application file for complete search history.

(56) References Cited

U.S. PATENT DOCUMENTS

| 5,629,772 | A   | * | 5/1997 | Ausschnitt ............. 356/625 |
| 6,687,561 | B1  | * | 2/2004 | Pasadyn et al. ........... 700/110 |
| 6,766,275 | B2  |   | 7/2004 | Samata et al. |
| 6,782,348 | B2  |   | 8/2004 | Ushiku |
| 6,947,805 | B1  | * | 9/2005 | Castle et al. ............. 700/121 |
| 2001/0051836 | A1 | * | 12/2001 | Lamey et al. ............ 700/110 |
| 2002/0193899 | A1 | * | 12/2002 | Shanmugasundram et al. ............. 700/108 |
| 2005/0095774 | A1 |   | 5/2005 | Ushiku et al. |

FOREIGN PATENT DOCUMENTS

JP 7-244694 9/1995

OTHER PUBLICATIONS

Ushiku, Y. et al., "Method For Determining A Failure Of A Manufacturing Condition, System For Determining A Failure Of A Manufacturing Condition And Method For Manufacturing An Industrial Product," U.S. Appl. No. 11/236,719, filed Sep. 28, 2005.

* cited by examiner

*Primary Examiner*—Albert DeCady
*Assistant Examiner*—Steven R Garland
(74) *Attorney, Agent, or Firm*—Finnegan, Henderson, Farabow, Garrett & Dunner, L.L.P.

(57) ABSTRACT

A quality control system has: a QC value storage unit, a data acquisition device, a device internal information storage unit, a recipe storage unit, a QC value prediction unit, a wafer determination unit, a recipe selection unit, and a measurement device.

20 Claims, 19 Drawing Sheets

| QC PREDICTION VALUE | RECIPE | |
|---|---|---|
| REGION A | (1-1) | SAMPLING DENSITY DOUBLED AT WAFER RIGHT PERIPHERY |
| | (1-2) | SAMPLING DENSITY DOUBLED AT WAFER CENTER |
| | (1-3) | MEASURE AT STANDARD SAMPLING DENSITY |
| | (1-4) | SAMPLING DENSITY DOUBLED AT WAFER PERIPHERY |
| | (1-5) | SAMPLING DENSITY DOUBLED AT WAFER LEFT PERIPHERY |
| | (1-6) | SAMPLING DENSITY DOUBLED WITHIN WAFER |
| REGION B | (2-1) | SAMPLING DENSITY DOUBLED AT WAFER LEFT PERIPHERY |
| | (2-2) | SAMPLING DENSITY DOUBLED AT WAFER PERIPHERY |
| | (2-3) | MEASURE AT STANDARD SAMPLING DENSITY |
| | (2-4) | SAMPLING DENSITY DOUBLED AT WAFER CENTER |
| | (2-5) | SAMPLING DENSITY DOUBLED AT WAFER RIGHT PERIPHERY |
| | (2-6) | SAMPLING DENSITY DOUBLED WITHIN WAFER |
| REGION C | MEASURE ONE WAFER EXHIBITING AVERAGE QC VALUE | |
| NOT ESTIMATABLE | MEASURE AT STANDARD SAMPLING DENSITY | |

ITEM NAME　　　＊＊＊＊
Lot No.　　　　＊＊＊＊＊
PROCESS NAME　＊＊＊＊＊＊
SPECIFICATION　p±q nm

| WAFER NO. | RECIPE NAME | QC PREDICTION VALUE | *DIFFERENCE 1 | *DIFFERENCE 2 | QC ACTUAL MEASUREMENT | | | | |
|---|---|---|---|---|---|---|---|---|---|
| | | | | | MEASUREMENT POINT | | | AVERAGE | 3σ |
| | | | | | 1 | 2 | 3 | | |
| 1 | (1-1) | a | a-p | a-d | | | | | |
| 2 | - | b | b-p | b-d | | | | | |
| 3 | (1-4) | c | c-p | c-d | | | | | |
| 4 | Nomal | d | d-p | - | | | | | |
| ⋯ | | | | | | | ⋯ | | |

*DIFFERENCE 1 = PREDICTION VALUE OF EACH WAFER−TARGET
*DIFFERENCE 2 = PREDICTION VALUE OF EACH WAFER−PREDICTION VALUE OF WAFER MEASURED USING STANDARD RECIPE

QUALITY CONTROL SYSTEM, QUALITY CONTROL METHOD, AND METHOD OF LOT-TO-LOT WAFER PROCESSING

CROSS-REFERENCE TO RELATED APPLICATIONS

This application is based upon and claims the benefit of priority from the prior Japanese Patent Application No. 2005-109209, filed on Apr. 5, 2005; the entire contents of which are incorporated herein by reference.

BACKGROUND OF THE INVENTION

1. Field of the Invention

This invention relates to a quality control system, a quality control method, and a method of lot-to-lot wafer processing, and more particularly to a quality control system, a quality control method, and a method of lot-to-lot wafer processing being applied to the technology of manufacturing semiconductor devices for providing lot quality control.

2. Background Art

Semiconductor devices are manufactured by numerous semiconductor manufacturing devices in a long, complicated series of numerous steps including lithography, etching, heat treatment (oxidation, annealing, and diffusion), ion implantation, thin film formation (CVD (Chemical Vapor Deposition), sputtering, and evaporation), cleaning (resist removal and solution cleaning), and inspection. In the inspection step, each lot is subjected to quality control by means of quality control measurement (hereinafter referred to as "QC measurement") and the like. "QC measurement" is a technique for measuring the film thickness, line width, or the like of a resist pattern formed on a wafer in each lot. The quality (defective or non-defective) of a wafer or wafers and of an entire lot is determined using the measurement results (QC actual measurements) (see JP 7-244694A (1995), for example).

In QC measurement, a plurality of wafers in an intended lot are extracted (sampled) for QC measurement in order to reduce time and cost. In general, conventional sampling techniques follow the practice for previous-generation products. That is, previously specified wafers in a lot remain to be sampled.

However, the parameters of the semiconductor manufacturing devices may depend, for example, on the result of seasoning that is performed before or after the dry etching process. This causes within-lot variation due to the parameter fluctuation of the semiconductor manufacturing devices before and after seasoning. If particular wafers are extracted (sampled) for QC measurement without taking this within-lot variation into consideration and the sampled wafers are determined to be non-defective, then the lot itself is determined to be non-defective even though it actually had a fraction defective high enough to be rejected as out of specification. Thus, defective lots may be missed.

SUMMARY OF THE INVENTION

According to an aspect of the invention, there is provided a quality control system comprising: a quality control value storage unit configured to store quality control actual measurements of past lots; a data acquisition device configured to acquire device internal information of a processing device that processes an intended lot; a device internal information storage unit configured to store the device internal information; a recipe storage unit configured to store a plurality of recipes, each recipe having a mutually different distribution of sampling density within a wafer; a quality control value prediction unit configured to read the device internal information from the device internal information storage unit, reading the quality control actual measurements of past lots from the quality control value storage unit, and predicting a quality control prediction value of the intended lot using the device internal information and the quality control actual measurements; a wafer determination unit configured to determine a sample wafer to be measured from among a plurality of wafers constituting the intended lot using the quality control prediction value; a recipe selection unit configured to read the plurality of recipes from the recipe storage unit and selecting an application recipe to be applied to the sample wafer from among the plurality of recipes using the quality control prediction value; and a measurement device configured to use the application recipe to make a quality control measurement on the sample wafer and storing a measurement result in the quality control value storage unit.

According to other aspect of the invention, there is provided a quality control method comprising: acquiring device internal information of a processing device that processes an intended lot; predicting a quality control prediction value of the intended lot using the quality control actual measurements of past lots and the device internal information; determining a sample wafer to be measured from among a plurality of wafers constituting the intended lot using the quality control prediction value; selecting an application recipe to be applied to the sample wafer from among a plurality of recipes using the quality control prediction value, each recipe having a mutually different distribution of sampling density within the wafer; and using the application recipe to make a quality control measurement on the wafer to be measured and storing a measurement result.

According to other aspect of the invention, there is provided a method of lot-to-lot wafer processing comprising: processing a first lot by a processing device and storing a quality control actual measurement thereof; processing a second lot by the processing device; acquiring device internal information of the processing device in the processing of the second lot; predicting a quality control prediction value of the second lot using the device internal information in the processing of the second lot and the quality control actual measurements of past lots; determining a sample wafer to be measured from among a plurality of wafers constituting the second lot using the quality control prediction value; selecting an application recipe to be applied to the sample wafer from among a plurality of recipes using the quality control prediction value, each recipe having a mutually different distribution of sampling density within the wafer; using the application recipe to make a quality control measurement on the sample wafer; and determining quality of the second lot using a result of the quality control measurement.

BRIEF DESCRIPTION OF THE DRAWINGS

FIG. 10 is a table listing recipes in accordance with the first embodiment of the invention;

FIG. 17 is a table showing part of a report that presents QC measurement results in accordance with the first embodiment of the invention;

DETAILED DESCRIPTION OF THE INVENTION

Figure 1:
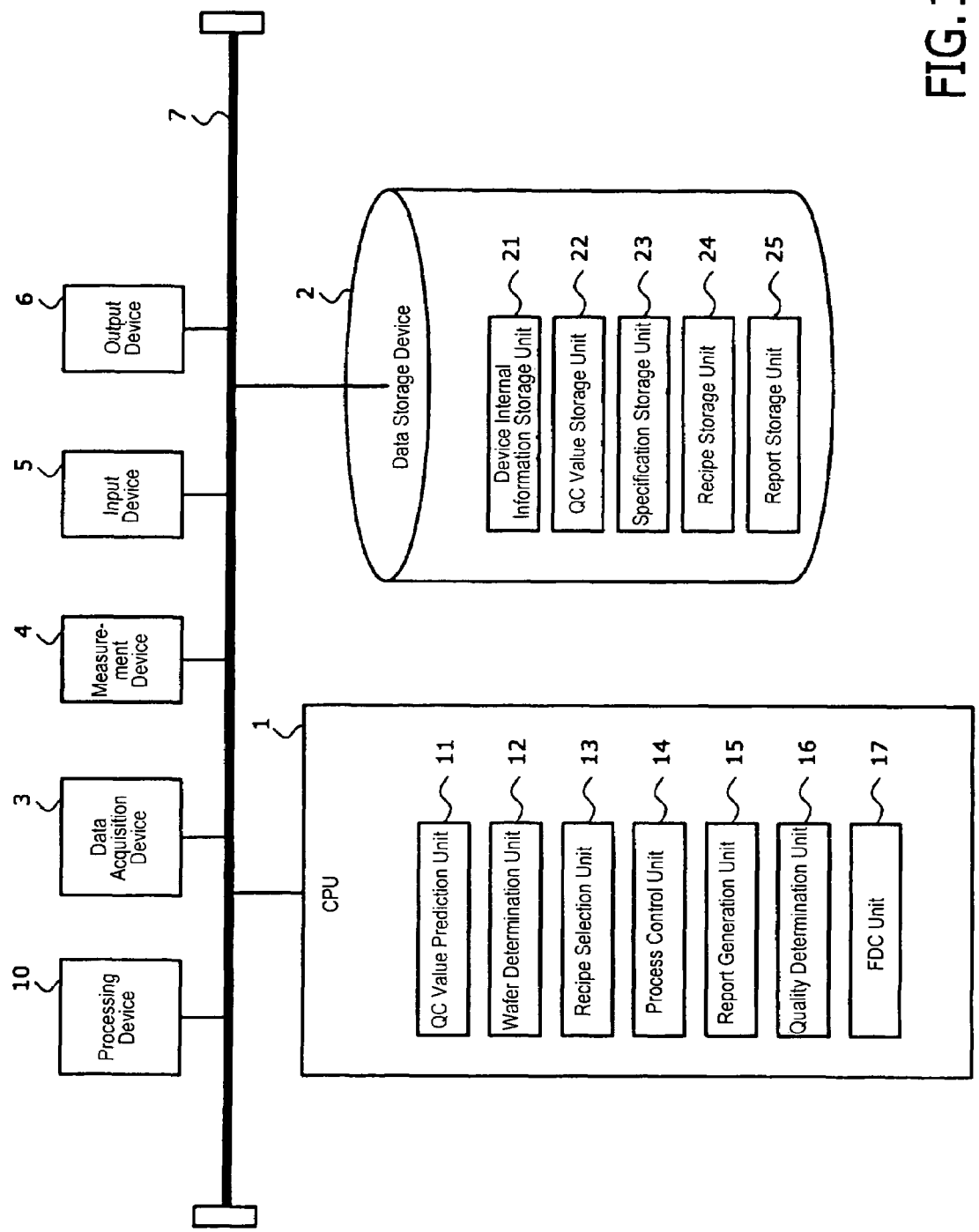
FIG. 1 is a block diagram showing an example quality control system in accordance with a first embodiment of the invention.

Embodiments of the invention will now be described with reference to the drawings, where like or similar components are marked with like or similar reference numerals, although the figures are schematic. The embodiments disclosed herein merely illustrate systems and methods for embodying the spirit of the invention, which is not limited to the materials, configurations, structures, and arrangements described below. The spirit of the invention may have various modifications as defined in the appended claims.

FIRST EMBODIMENT

As shown in FIG. 1, the quality control system in accordance with the first embodiment of the invention comprises a QC value storage unit 22 that stores QC actual measurements of past lots, a data acquisition device 3 that acquires in real time the device internal information of a processing device 10 processing an intended lot, a device internal information storage unit 21 that stores the device internal information, a recipe storage unit 24 that stores a plurality of recipes classified by the distribution of sampling density within a wafer, a QC value prediction unit 11 that reads the device internal information and the QC actual measurements of past lots from the device internal information storage unit 21 and the QC value storage unit 22, respectively, and predicts a QC prediction value of the intended lot using the device internal information and the QC actual measurements, a wafer determination unit 12 that determines a sample wafer to be measured from among a plurality of wafers constituting the intended lot using the QC prediction value, a recipe selection unit 13 that reads a plurality of recipes from the recipe storage unit 24 and selects an application recipe to be applied to the sample wafer from among the plurality of recipes using the QC prediction value, and a measurement device 4 that makes a QC measurement on the wafer to be measured using the application recipe and stores the measurement result in the QC value storage unit 22.

The quality control system includes a central processing unit (CPU) 1, data storage device 2, data acquisition device 3, measurement device 4, input device 5, output device 6, and processing device 10 interconnected via a bus 7. The CPU 1 also functions as a device group control server that controls the operation of the processing device 10 and a group of other devices (not shown) and as an administration server that receives the device internal information (Equipment Engineering data (EE data)) describing the operating condition and device parameters of the processing device 10 and monitors the operating status of the processing device 10 in real time. Note that FIG. 1 shows a single CPU 1 for illustrative purposes only. A plurality of CPUs, device group control servers, and administration servers may exist physically.

The processing device 10 includes various semiconductor manufacturing devices including: ion implantation device; impurity diffusion device; thermal oxidation device for forming silicon oxide film ($SiO_2$ film); chemical vapor deposition (CVD) device for depositing $SiO_2$ film, phosphosilicate glass (PSG) film, borosilicate glass (BSG) film, borophosphosilicate glass (BPSG) film, silicon nitride film ($Si_3N_4$ film), polysilicon film, and the like; heat treatment device for reflowing (melting) PSG film, BSG film, BPSG film, and the like; heat treatment device for densifying CVD oxide film and the like; heat treatment device for forming suicide film and the like; sputtering device for depositing a metal interconnect layer; vacuum evaporation device; plating device for forming an additional metal interconnect layer by plating; chemical mechanical polishing (CMP) device for polishing the surface of a semiconductor substrate; dry or wet etching device for etching a semiconductor substrate surface; cleaning device for resist removal or solution cleaning; spin coating device (spinner) associated with photolithography; exposure device such as a stepper; dicing device; and bonding device for connecting the electrode of a diced, chip-like semiconductor device to a lead frame. Moreover, the processing device 10 may include accessory facilities such as a water purifier and gas purifier. These semiconductor manufacturing devices can be adapted to both batch and single wafer systems. Likewise, any of the embodiments described below may be applied to both batch and single wafer systems.

The data acquisition device 3 can be an equipment engineering system (EES) tool or the like. The data acquisition device 3 acquires the device internal information of the processing device 10 in the course of processing on a wafer by wafer basis in real time and transmits it to the CPU 1 at a predetermined timing. For example, in the case of the processing device 10 having a chamber such as a film formation device, diffusion device, and thin film deposition device in a vacuum processing system, the device internal information can include temperature at a plurality of positions in the chamber, susceptor temperature, temperature at a plurality of positions on the outer wall of the chamber, chamber pressure, gas flow rate, and valve travel that controls gas flow rate. In the case of the processing device 10 having an electrode such as a dry etching device and ion implantation device in a plasma processing system, the device internal information can include, in addition to the various parameters of the vacuum processing system described above, a radio frequency (RF) matching position, RF power (traveling wave power and reflecting wave power), and wafer position information indicating the ordinal position of the current wafer in the lot. In the case of the processing device 10 being a wet etching device, spin coating device, exposure device, and bonding device in an atmospheric processing system, the device internal information can include processing time and wafer or chip position information.

Figure 2:
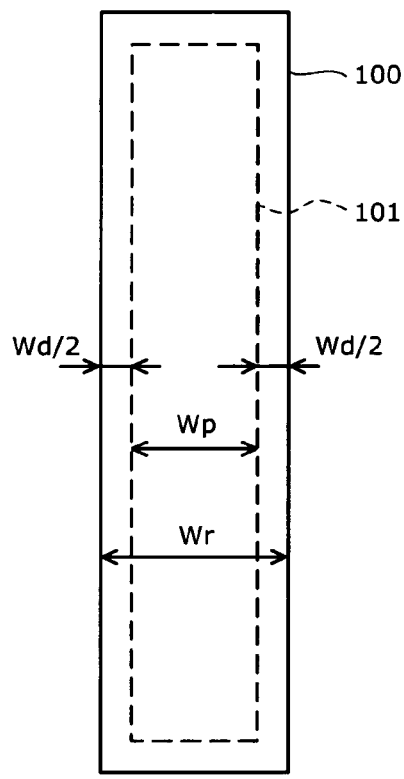
FIG. 2 is a plan view showing example QC prediction values (pattern shifts) in accordance with the first embodiment of the invention.

The measurement device 4 makes a QC measurement on a wafer in an intended lot processed by the processing device 10. The measurement device 4 can be a microscope such as a scanning electron microscope (SEM), laser microscope, or atomic force microscope (AFM). The measurement device 4 may also be any of various inspection or measurement devices such as an interferometric film thickness meter, ellipsometer, contact-type film thickness meter, and resistometer. The measurement device 4 measures the line width Wr of a resist pattern 100 as shown in FIG. 2 formed on a wafer in the lithography process, for example. It also measures the line width Wp of a finished pattern (device pattern) 101 formed on an etching material in the etching process that uses the resist pattern 100 as a mask. Consequently, the pattern shift Wd between the line width Wr of the resist pattern 100 and the line width Wp of the finished pattern 101 is measured as a "QC actual measurement". The QC actual measurement is measured at a plurality of measurement positions in each wafer.

When the processing device 10 is an etching device, for example, the inside of the etching chamber is subjected to cleaning and seasoning before and after the etching process. The result of this seasoning affects the parameters of the device internal information and therefore may cause lot-to-lot and/or wafer-to-wafer variation in the processes before and after the seasoning. For example, the capacitor position of an RF matcher, which is a parameter of the device internal information of the etching device, is correlated with the pattern shift Wd as shown in FIG. 2. More specifically, a deviation of the capacitor position of the RF matcher may vary the line width Wp of the finished pattern 101, thereby causing lot-to-lot and/or wafer-to-wafer variation in the pattern shift Wd.

The CPU 1 shown in FIG. 1 comprises a QC value prediction unit 11, wafer determination unit 12, recipe selection unit 13, process control unit 14, report generation unit 15, quality determination unit 16, and fault detection/classification (FDC) unit 17. The QC value prediction unit 11 reads past device internal information stored in the device internal information storage unit 21 of the data storage device 2 and the QC actual measurements of past lots stored in the QC value storage unit 22 of the data storage device 2. Referring to the correlation between the past device internal information and the QC actual measurements of past lots, the QC value prediction unit 11 predicts the pattern shift Wd and the like shown in FIG. 2 as a "QC prediction value" for each wafer constituting the intended lot using the device internal information at the time of processing the lot acquired by the data acquisition device 3. That is, each wafer is associated with one or more QC prediction values. Note that the QC prediction value can be predicted further using the lot type, process condition, and the like.

Figure 3:
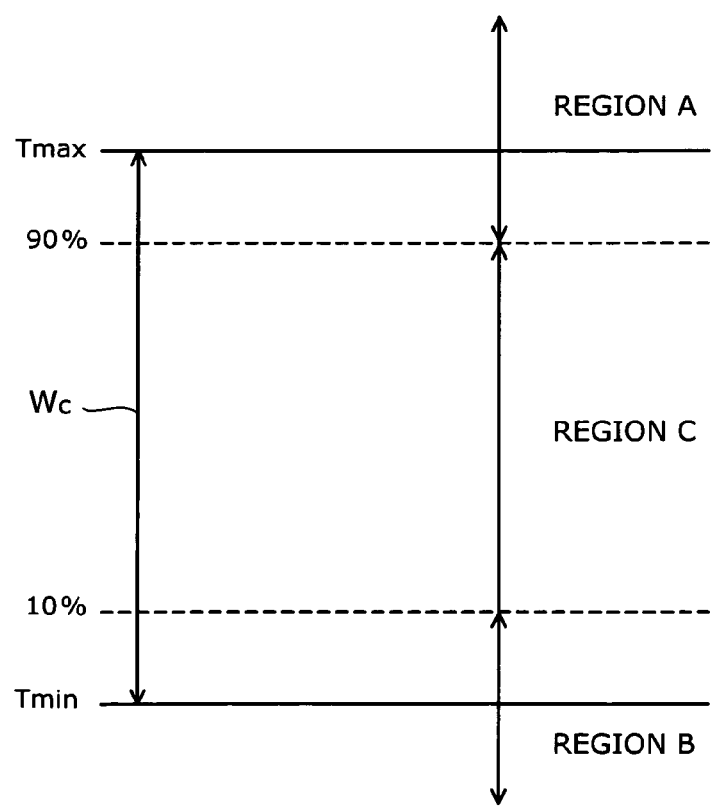
FIG. 3 is a graph illustrating an example specification in accordance with the first embodiment of the invention.

The wafer determination unit 12 shown in FIG. 1 reads the QC prediction value predicted by the QC value prediction unit 11 and the specification control width Wc stored in the specification storage unit 23 of the data storage device 2. As shown in FIG. 3, the specification control width Wc indicates an allowable range of QC values for obtaining a desired specification and is defined by the specification maximum Tmax and specification minimum Tmin within which the desired specification can be obtained. The specification region, that is, the distribution range of QC prediction values, is partitioned into "specification region A" consisting of values not less than the sum of the specification minimum Tmin and 90% of the specification control width Wc, "specification region B" consisting of values not more than the sum of the specification minimum Tmin and 10% of the specification control width Wc, and "specification region C" consisting of values being more than the sum of the specification minimum Tmin and 10% of the specification control width Wc and being less than the sum of the specification minimum Tmin and 90% of the specification control width Wc. The specification regions A and B have higher out-of-specification probability, that is, the probability that the QC actual measurement falls outside the specification control width Wc, than the specification region C. The specification region C includes a target QC prediction value and ranges in the vicinity of the desired (target) value, where the out-of-specification probability is lower.

The wafer determination unit 12 determines which of the specification regions A, B, and C shown in FIG. 3 corresponds to the QC prediction value of each wafer constituting the intended lot predicted by the QC value prediction unit 11. Note that the determination can be done by using a statistical value, for example, an average value, a maximum value, a minimum value or a value determined by calculation based on the average value and a standard deviation of a plurality of QC prediction values when the plurality of QC prediction values associate each wafer. For example, it may be determined that a specification region corresponds to specified ratio or more of the plurality of QC prediction values is the specification region of the wafer. Or, the determination may be done based on the combinations of the statistical value or the distribution of the plurality of QC prediction values and information of within-wafer position of the plurality of QC prediction values.

As a result of the determination, when the QC prediction value falls under the specification region A or B, the current wafer is determined to be a "sample wafer" to be measured because it has higher out-of-specification probability. However, when the QC prediction value falls under the specification region C, the current wafer is not selected for measurement at the time of the determination because it has lower out-of-specification probability. After determination is made on all the wafers in the intended lot, one wafer, for example, that appears to exhibit an average QC prediction value is determined to be a sample wafer from among all the wafers in the lot falling under the specification region C. That is, with regard to the intended lot, the wafer determination unit 12 selects for measurement all the wafers that have higher out-of-specification probability and fewer wafers, e.g. a minimum of only one wafer, having lower out-of-specification probability.

The recipe selection unit 13 shown in FIG. 1 reads a QC prediction value corresponding to the sample wafer determined by the wafer determination unit 12 from among the QC prediction values of the wafers constituting the intended lot stored in the QC value storage unit 22 of the data storage device 2. On the other hand, the relative within-wafer distribution of QC prediction values predicted for each sample wafer is classified in advance as shown in FIGS. 4 to 9, for example, using the rate of contribution of the device internal information to the QC actual measurements of past lots and using the device internal information of the current intended lot.

Figure 4:
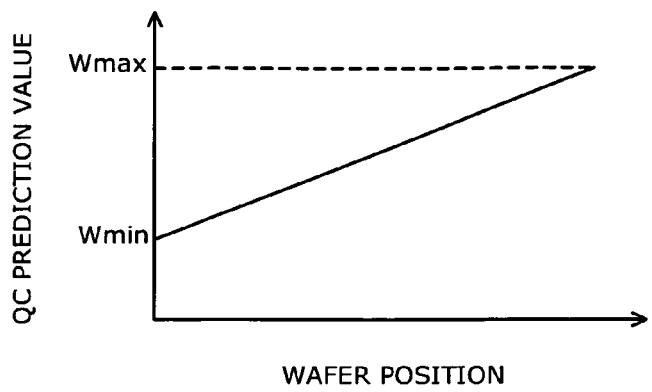
FIGS. 4 to 9 are graphs illustrating within-wafer distribution trends of QC prediction values (pattern shifts) in accordance with the first embodiment of the invention.
Figure 5:
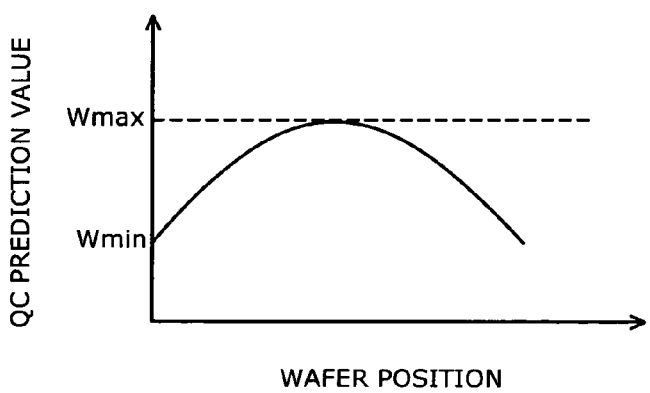
Figure 6:
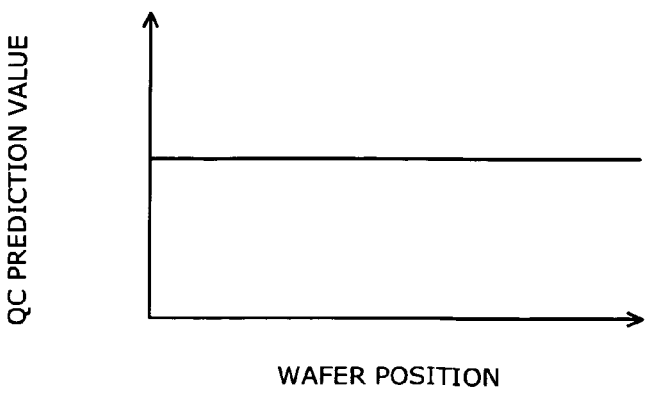
Figure 7:
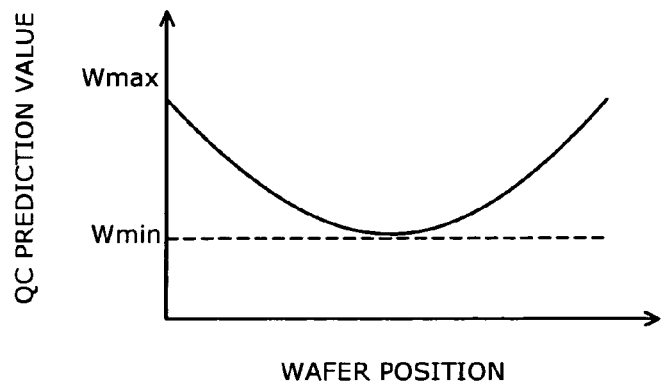
Figure 8:
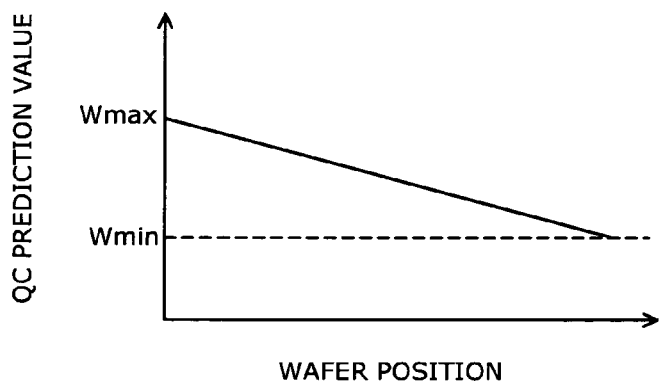
Figure 9:
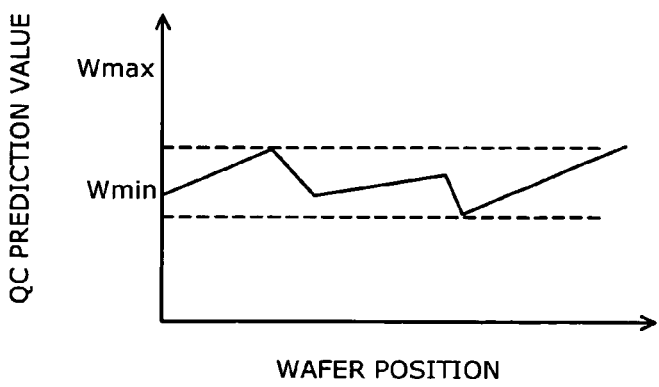

FIGS. 4 to 9 are graphical diagrams illustrating within-wafer distribution patterns of QC prediction values where the horizontal axis represents position in the wafer, and the vertical axis represents QC prediction values. In the following, for convenience, the wafer position corresponding to the right (plus) side edge on the horizontal axis is referred to as "wafer right periphery", whereas the wafer position corresponding to the left (minus) side edge on the horizontal axis is referred to as "wafer left periphery". FIG. 4 shows a within-wafer distribution in which the QC prediction value has a maximum Wmax at the wafer right periphery and monotonically decreases toward the wafer left side. FIG. 5 shows a within-wafer distribution in which the QC prediction value has a maximum Wmax at the wafer center and is convex upward. FIG. 6 shows a uniform within-wafer distribution in which, for example, the difference between the maximum and minimum of the QC prediction value is less than 2 nm. FIG. 7 shows a within-wafer distribution in which the QC prediction value has a maximum Wmax at the wafer periphery and is convex downward. FIG. 8 shows a within-wafer distribution in which the QC prediction value has a maximum Wmax at the wafer left periphery and monotonically decreases toward the wafer right side. FIG. 9 shows a random within-wafer distribution in which the difference between the maximum Wmax and minimum Wmin of the QC prediction value is 2 nm or more.

Using the within-wafer distribution of QC prediction values, the recipe selection unit 13 selects and determines an "application recipe", which is a QC recipe to be applied to the sample wafer in the intended lot, from among a plurality of recipes stored in the recipe storage unit 24. The recipe storage unit 24 shown in FIG. 1 stores recipes including (1-1) to (1-6), (2-1) to (2-6), and a standard recipe, for example, as shown in FIG. 10. The recipes (1-1) to (1-6), (2-1) to (2-6), and standard recipe classify the sampling density for the specification regions A to C shown in FIG. 3 and for the within-wafer distribution patterns shown in FIGS. 4 to 9.

FIGS. 11 to 16 are schematic views illustrating QC recipes where the circle in the figures represents a sample wafer 103, and rectangular areas represent shot areas 104, of which areas filled in with black represent shot areas to be sampled. The recipe selection unit 13 shown in FIG. 1 selects an application recipe by which shot areas (sites) having high out-of-specification probability within the wafer are sampled and measured at high density.

Figure 11:
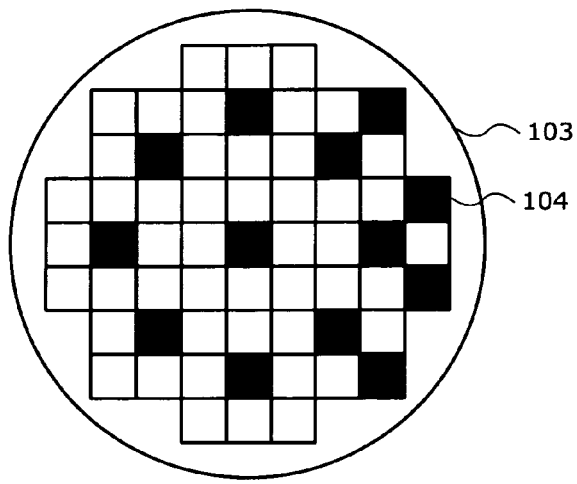
FIGS. 11 to 16 are schematic views of a wafer for illustrating a procedure of sampling shot areas in accordance with the first embodiment of the invention.
Figure 12:
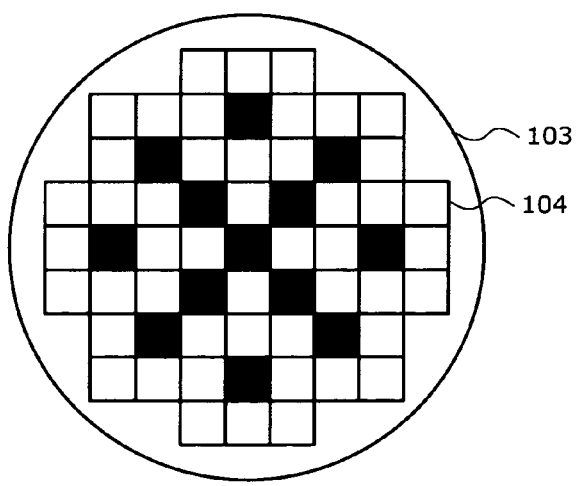
Figure 13:
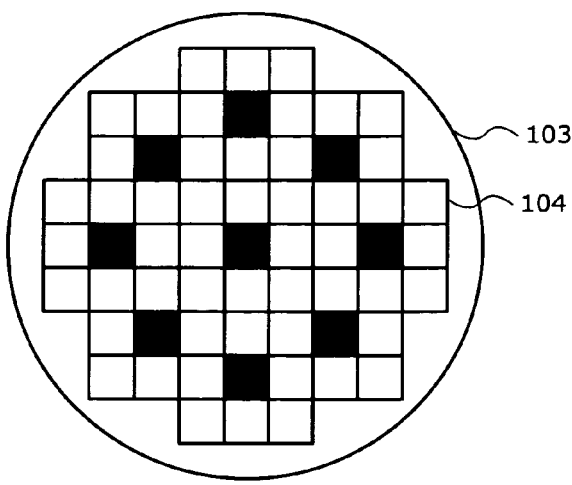
Figure 14:
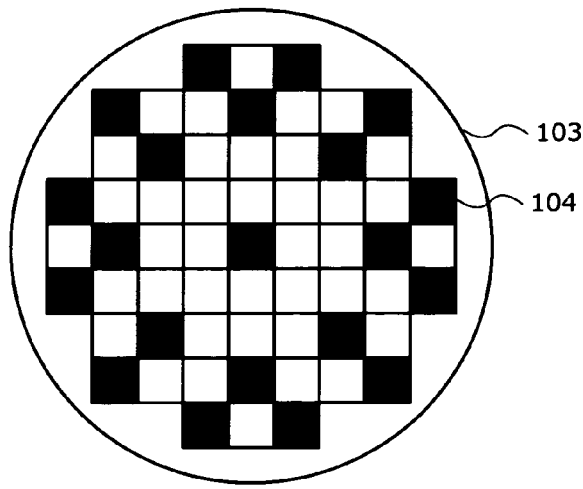
Figure 15:
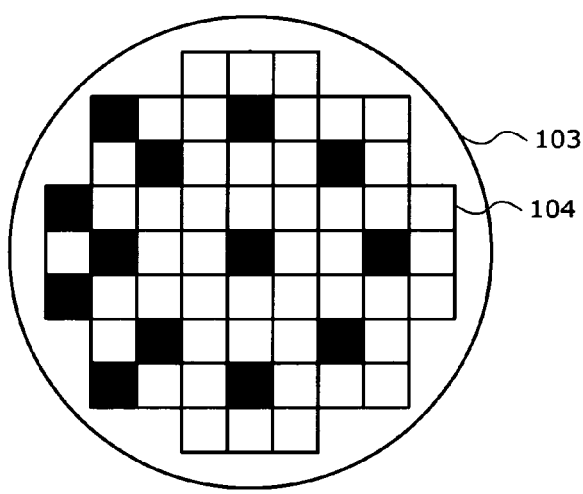
Figure 16:
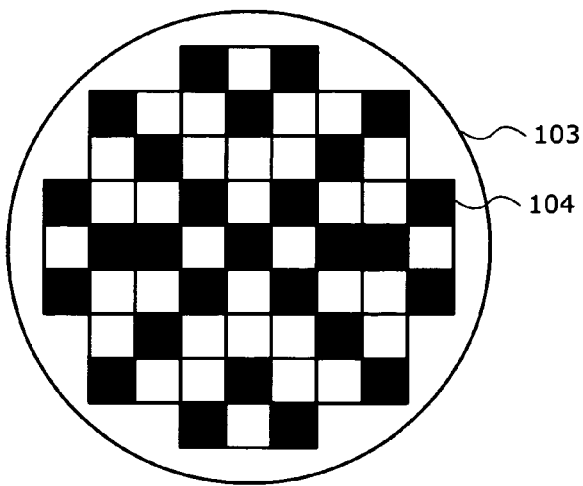

For example, when it is predicted that the QC prediction value of a wafer falls under the specification region A, an application recipe is selected from the group of recipes (1-1) to (1-6) shown in FIG. 10 as described below. When the QC prediction value of the intended lot has a relative within-wafer distribution that monotonically decreases toward the left side as shown in FIG. 4, the wafer right periphery has high out-of-specification probability, and hence the selected recipe is recipe (1-1) in which the sampling density at the right periphery of the sample wafer 103 is twice that of the standard recipe as shown in FIG. 11. When the QC prediction value has a within-wafer distribution that is convex upward as shown in FIG. 5, the wafer center has high out-of-specification probability, and hence the selected recipe is recipe (1-2) in which the sampling density at the center of the sample wafer 103 is twice that of the standard recipe as shown in FIG. 12. When the within-wafer distribution is uniform as shown in FIG. 6, the out-of-specification probability within the wafer is also uniform, and hence the selected recipe is recipe (1-3) in which the sampling density is uniform like the standard recipe as shown in FIG. 13. When the QC prediction value has a within-wafer distribution that is convex downward as shown in FIG. 7, the wafer periphery has high out-of-specification probability, and hence the selected recipe is recipe (1-4) in which the sampling density at the periphery of the sample wafer 103 is twice that of the standard recipe as shown in FIG. 14. When the QC prediction value monotonically decreases toward the right side as shown in FIG. 8, the wafer left periphery has high out-of-specification probability, and hence the selected recipe is recipe (1-5) in which the sampling density at the left periphery of the sample wafer 103 is twice that of the standard recipe as shown in FIG. 15. When the within-wafer distribution is random as shown in FIG. 9, the entire wafer needs to be monitored more intensively, and hence the selected recipe is recipe (1-6) in which the sampling density within the entire wafer is twice that of the standard recipe as shown in FIG. 16.

In contrast, when the QC prediction value of a wafer falls under the specification region B, an application recipe is selected from the group of recipes (2-1) to (2-6) shown in FIG. 10 as follows. When the QC prediction value has a relative within-wafer distribution that monotonically increases toward the right side as shown in FIG. 4, the wafer left periphery has high out-of-specification probability, and hence the selected recipe is recipe (2-1) in which the sampling density at the left periphery of the sample wafer 103 is twice that of the standard recipe as shown in FIG. 15. Likewise, when the QC prediction value has a within-wafer distribution that is convex upward as shown in FIG. 5, the selected recipe is recipe (2-2) in which the sampling density at the periphery of the sample wafer 103 is twice that of the standard recipe as shown in FIG. 14. When the within-wafer distribution is uniform as shown in FIG. 6, the selected recipe is recipe (2-3) like the standard recipe as shown in FIG. 13. When the within-wafer distribution is convex downward as shown in FIG. 7, the selected recipe is recipe (2-4) in which the sampling density at the center of the sample wafer 103 is twice that of the standard recipe as shown in FIG. 12. When the QC prediction value monotonically increases toward the left side as shown in FIG. 8, the selected recipe is recipe (2-5) in which the sampling density at the right periphery of the sample wafer 103 is twice that of the standard recipe as shown in FIG. 11. When the within-wafer distribution is random as shown in FIG. 9, the selected recipe is recipe (2-6) in which the sampling density within the entire wafer is twice that of the standard recipe as shown in FIG. 16.

For wafers that have a QC prediction value falling under the specification region C, one wafer, for example, exhibiting an average QC value is extracted from among these wafers, and the standard recipe as shown in FIG. 13 is selected for this particular wafer. Finally, the standard recipe is selected for wafers having a QC prediction value that cannot be determined which of the specification regions A to C corresponds thereto.

The process control unit 14 shown in FIG. 1 controls the process of the measurement device 4. The measurement device 4 uses the application recipe determined by the recipe selection unit 13 from among recipes (1-1) to (1-6), (2-1) to (2-6), and standard recipe, to sample the shot areas 104 in the sample wafer 103 indicated by black fill as shown in FIGS. 11 to 16. The measurement device 4 then makes a QC measurement on the sampled shot areas 104 and obtains a pattern shift and the like as a "QC actual measurement".

Figure 18:
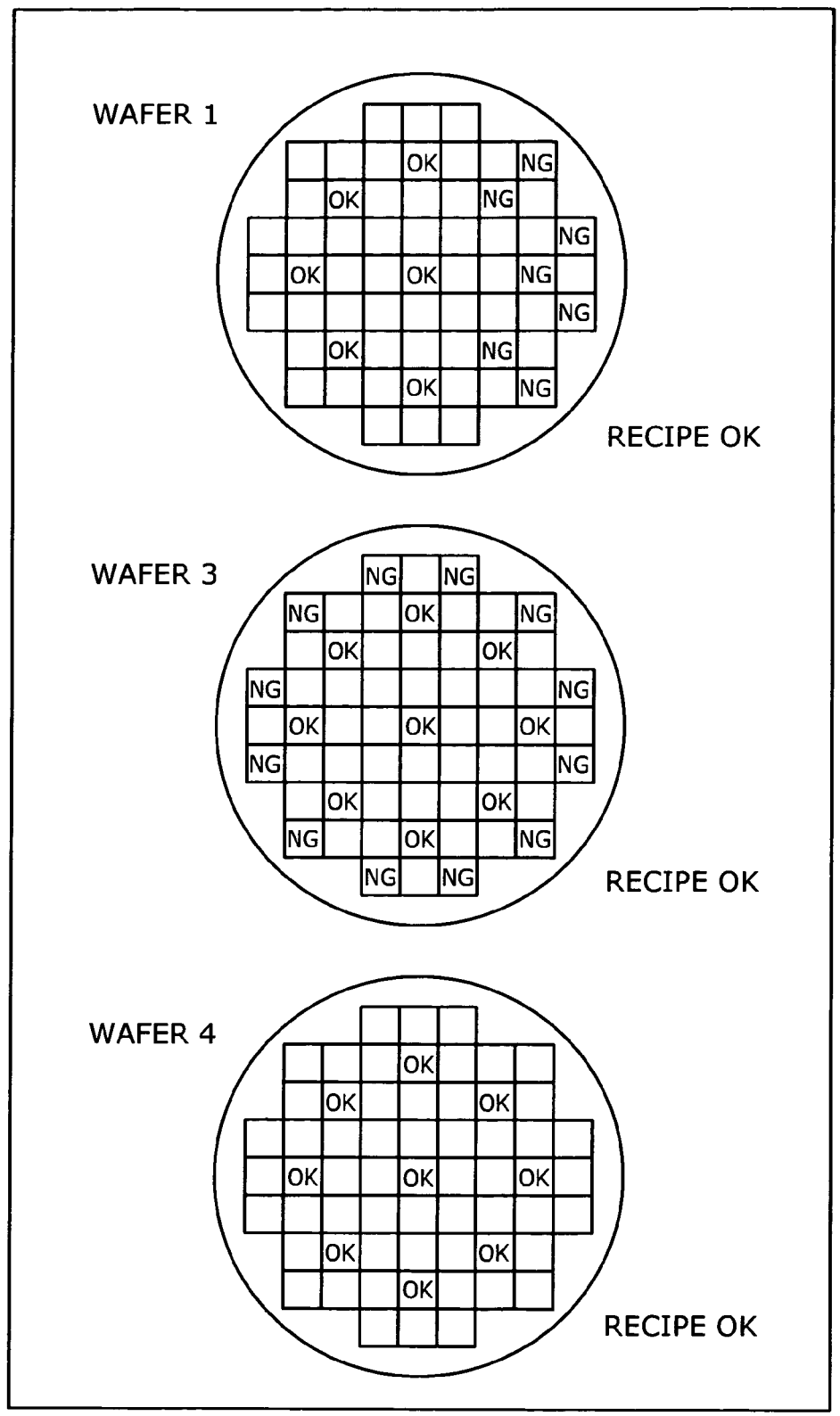
FIG. 18 is a schematic view of wafers showing part of the report that presents QC measurement results in accordance with the first embodiment of the invention.

The report generation unit 15 shown in FIG. 1 generates a report that presents QC measurement results as shown in FIGS. 17 to 26. The report shown in FIG. 17 lists the wafer number for each wafer, and the recipe name, QC prediction value, and QC actual measurement for each sample wafer. The report also lists the difference 1 between the QC prediction value of each wafer and the target value p and the difference 2 between the QC prediction value of each wafer and the QC prediction value d of the wafers measured in the specification region C. FIG. 18 presents the within-wafer distribution of QC prediction values and the validation result of the recipe selection. The within-wafer trend of QC actual measurements substantially matching that of the within-wafer trend classification of the device internal information is marked as "recipe OK". Otherwise, it is marked as "recipe NG", which indicates false recipe selection and/or dynamic sampling, requiring to modify the classification of within-wafer trends estimated from the device internal information.

Figure 19:
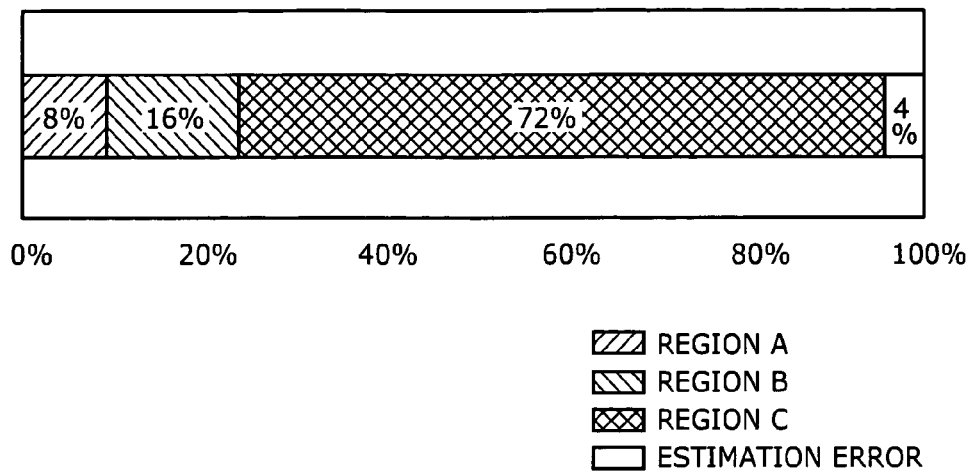
FIG. 19 is a graph showing the occupancy rate of each region as part of the report that presents QC measurement results in accordance with the first embodiment of the invention.
Figure 20:
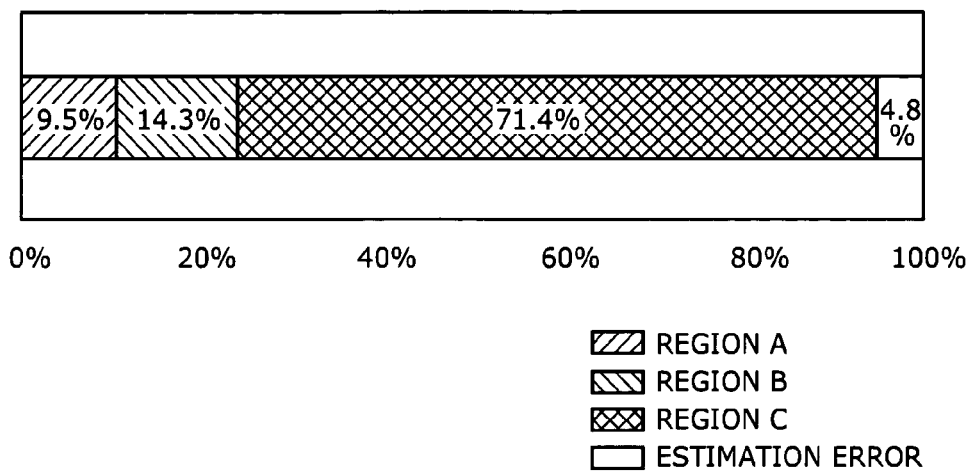
FIG. 20 is a graph showing the cumulative occupancy rate of each region as part of the report that presents QC measurement results in accordance with the first embodiment of the invention.
Figure 21:
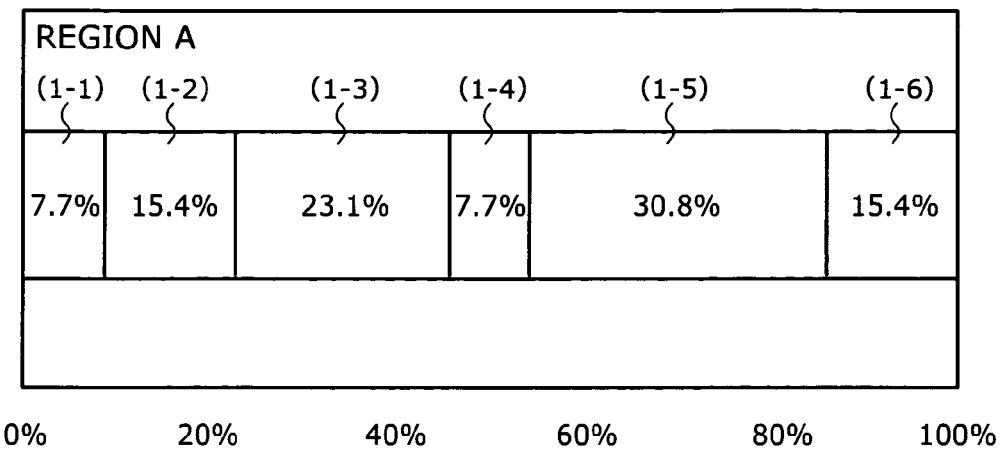
FIG. 21 is a graph showing the occupancy rate of each recipe for the specification region A as part of the report that presents QC measurement results in accordance with the first embodiment of the invention.
Figure 22:
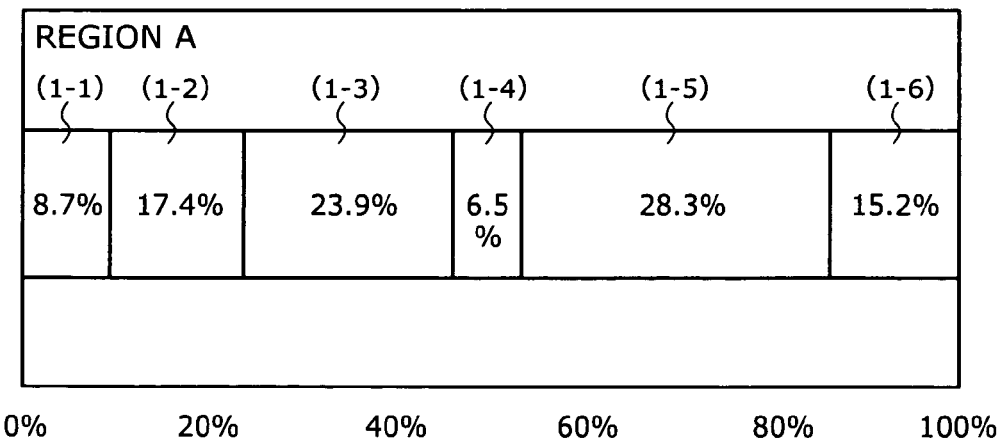
FIG. 22 is a graph showing the cumulative occupancy rate of each recipe for the specification region A as part of the report that presents QC measurement results in accordance with the first embodiment of the invention.
Figure 23:
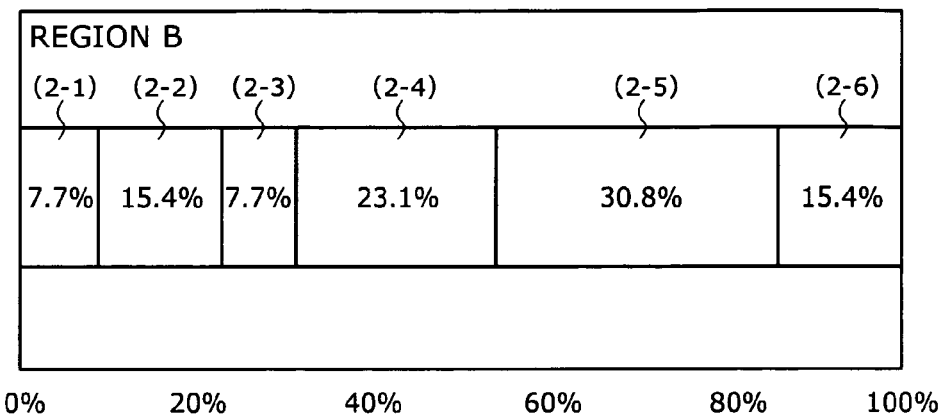
FIG. 23 is a graph showing the occupancy rate of each recipe for the specification region B as part of the report that presents QC measurement results in accordance with the first embodiment of the invention.
Figure 24:
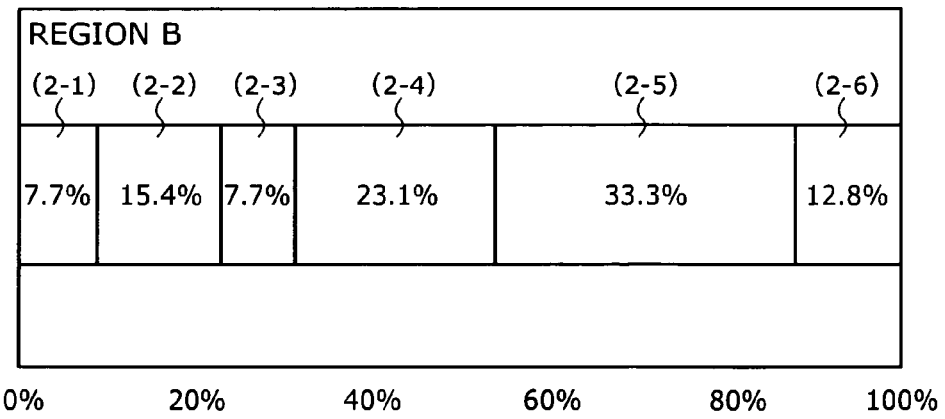
FIG. 24 is a graph showing the cumulative occupancy rate of each recipe for the specification region B as part of the report that presents QC measurement results in accordance with the first embodiment of the invention.
Figure 25:
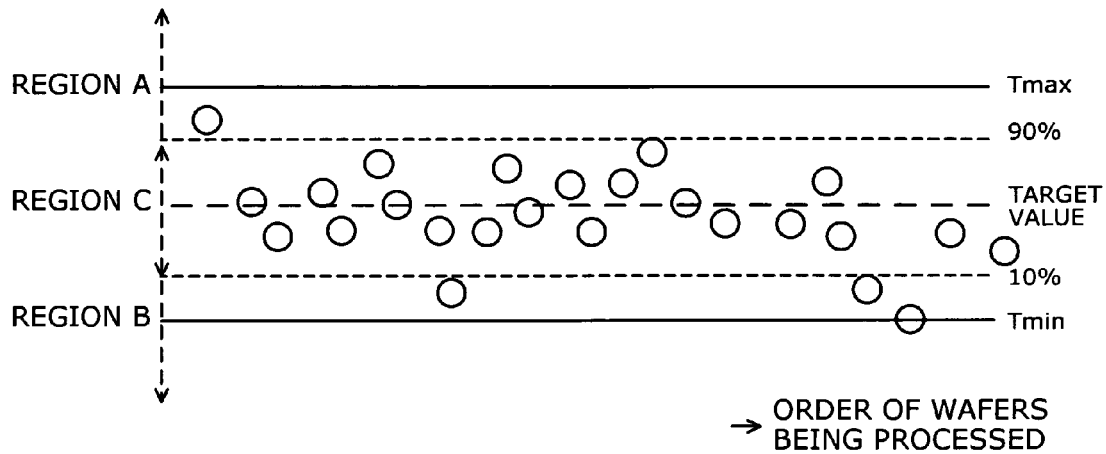
FIG. 25 is a graph showing the within-lot variation of QC prediction values as part of the report that presents QC measurement results in accordance with the first embodiment of the invention.
Figure 26:
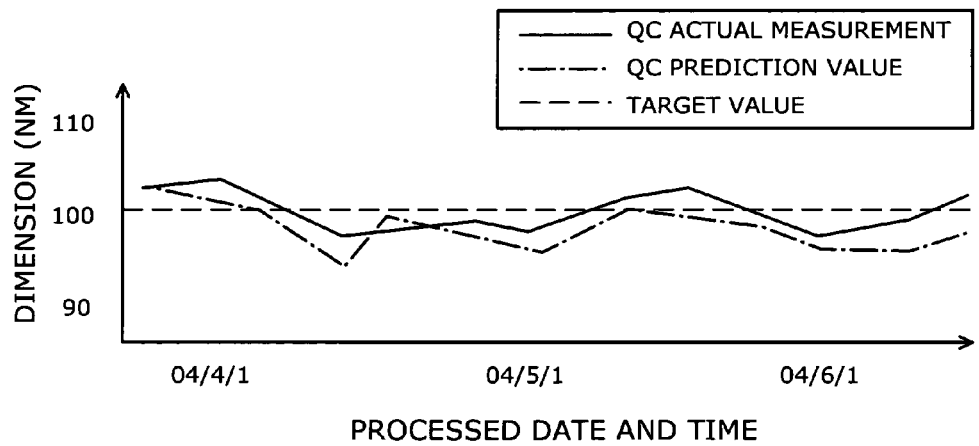
FIG. 26 is a graph showing the trend of QC values as part of the report that presents QC measurement results in accordance with the first embodiment of the invention.

FIGS. 19 and 20 show part of a report presenting the frequency of lots for each specification region and the cumulative frequency for each specification region, respectively. The time period for which the cumulative frequency is aggregated can be arbitrarily selected as appropriate. FIGS. 21 and 22 show, for each lot, the frequency and the cumulative frequency, respectively, of recipes applied to the wafers having a QC prediction value falling under the specification region A. FIGS. 23 and 24 show, for each lot, the frequency and the cumulative frequency, respectively, of recipes applied to the wafers having a QC prediction value falling under the specification region B. FIG. 25 shows a plot of QC prediction values for all the wafers in the lot. FIG. 26 shows the target value and the trend of QC prediction values and QC actual measurements falling under the specification region C.

The quality determination unit 16 shown in FIG. 1 refers to the specification control width Wc stored in the specification storage unit 23 to determine the quality of the lot using the QC actual measurements. For example, the quality determination unit 16 determines a lot as non-defective when all the QC actual measurements fall within the specification control width Wc, and as defective when there is any QC actual measurement falling outside the specification control width Wc. Note that the quality determination may be made by a human operator through visual examination of the reports shown in FIGS. 17 to 26. The FDC unit 17 shown in FIG. 1 detects a fault when any QC prediction value falls extremely outside the specification control width Wc, and informs the output device and the like of the occurrence of the fault and its type. Furthermore, it can direct the processing device 10 to pause or abort its process.

The CPU 1 is further equipped with a storage device management unit, not shown. When input/output of data on the data storage device 2 is needed, the storage device management unit is used to read or write any required file or files. Furthermore, the CPU 1 has input/output controllers (interfaces), not shown, connected to the input device 5, output device 6, and the like. The input device 5 can include, for example, a keyboard, mouse, recognition device such as an OCR (Optical Character Reader), graphic input device such as an image scanner, and other special input devices such as a voice input device. An administrator (factory administrator) can use the input device 5 to specify input/output data or to change applications being used. Furthermore, the input device 5 can also be used to set a model for use in analysis and to input directions such as execution or cancellation of operations. The output device 6 can include a display device such as a liquid crystal display or CRT (Cathode-Ray Tube) display and a printing device such as an ink jet printer or laser printer. The output device 6 may display input/output data or its analysis result, abnormal/normal status, or analysis parameters, so that the factory administrator can monitor the quality control system in a unified manner.

The data storage device 2 comprises a device internal information storage unit 21 that stores and accumulates the device internal information acquired by the data acquisition device 3, a QC value storage unit 22 that stores and accumulates past and current QC actual measurements measured by the measurement device 4, a specification storage unit 23 that stores the specification control width Wc shown in FIG. 3, a recipe storage unit 24 that stores recipes shown in FIG. 10, and a report storage unit 25 that stores reports as shown in FIGS. 17 to 26 generated by the report generation unit 15. The data storage device 2 has a ROM (Read Only Memory) and RAM (Random Access Memory) incorporated therein. The ROM functions as a program storage device that stores programs executed on the CPU 1. The RAM functions as a temporary data memory for temporarily storing data used during execution of programs or for use as a work area. The data storage device 2 can include a semiconductor memory, magnetic disc, optical disc, magneto-optical disc, and magnetic tape, for example.

Figure 27:
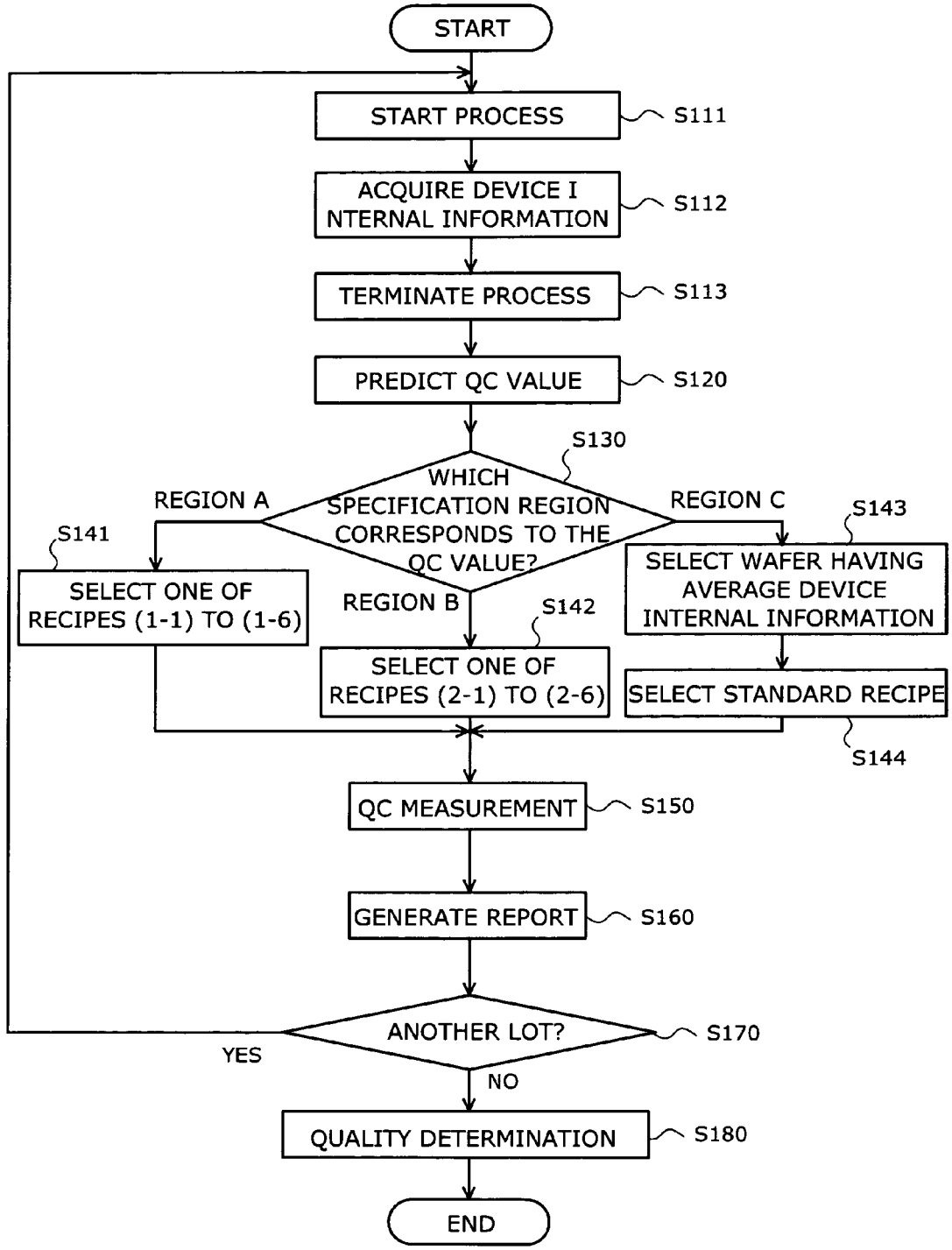
FIG. 27 is a flow chart for illustrating an example quality control method in accordance with the first embodiment of the invention.

Reference is now made to the flow chart of FIG. 27 to describe an example quality control method that uses the quality control system shown in FIG. 1.

(1) In step S111, a wafer process for an intended lot is started using the processing device 10 shown in FIG. 1. In step S112, the data acquisition device 3 acquires device internal information in real time from the processing device 10 in the course of processing. The acquired device internal information is stored in the device internal information storage unit 21 as needed. In step S113, the wafer process is terminated.

(2) In step S120, the QC value prediction unit 11 reads past device internal information stored in the device internal information storage unit 21 the QC actual measurements of past lots stored in the QC value storage unit 22. Referring to the correlation between the QC actual measurements of past lots and the past device internal information, the QC value prediction unit 11 predicts a "QC prediction value" such as the pattern shift Wd as shown in FIG. 2, for example, for each wafer in the intended lot using the device internal information of the intended lot acquired by the data acquisition device 3 in step S112.

(3) In step S130, the wafer determination unit 12 reads the specification control width Wc shown in FIG. 3 from the specification storage unit 23 and determines which of the specification regions A, B, and C in the specification control width Wc corresponds to the QC prediction value of each wafer in the intended lot. When the QC prediction value falls under the specification region A or B, the current wafer is determined to be a sample wafer, and the flow proceeds to step S141 or S142, respectively. However, when the QC prediction value falls under the specification region C, the current wafer is not selected for measurement at this time. The flow proceeds to step S143, where the wafer determination unit 12 determines one wafer exhibiting average device internal information to be a sample wafer from among all the wafers in the lot falling under the specification region C. The flow then proceeds to step S144.

(4) In step S141, the recipe selection unit 13 reads a plurality of recipes (see FIG. 10) stored in the recipe storage unit 24, that is, a plurality of recipes classified by the distribution of sampling density in the wafer. For each sample wafer, the recipe selection unit 13 selects, from among the recipes (1-1) to (1-6), an application recipe by which shot areas having high out-of-specification probability are sampled at high density in accordance with the within-wafer distributions shown in FIGS. 4 to 9. In step S142, the recipe selection unit 13 selects, from among the recipes (2-1) to (2-6), an application recipe by which shot areas having high out-of-specification probability are sampled at high density in accordance with the within-wafer distributions shown in FIGS. 4 to 9. In step S144, as an application recipe to be applied to the wafers falling under the specification region C and to the wafers in which abnormality such as random distribution of QC prediction values within the wafer is detected, the recipe selection unit 13 selects the standard recipe by which uniform sampling is performed within the wafer.

(5) In step S150, for each sample wafer out of a plurality of wafers constituting the intended lot, the measurement device 4 uses the application recipe selected by the recipe selection unit 13 from among the recipes (1-1) to (1-6), (2-1) to (2-6), and standard recipe, to sample shot areas to be measured within the wafer and make a QC measurement. The measurement result (QC actual measurement) is stored in the QC value storage unit 22.

(6) In step S160, for the intended lot, the report generation unit 15 generates a report that presents QC measurement results and the like as shown in FIGS. 17 to 26. The generated report is outputted by the output device 6 as a monitor display and the like. In step S170, if there is another lot, the flow returns to step S111. If all the lots have been processed, the flow proceeds to step S180. In step S180, the quality determination unit 16 determines the quality of the intended lot using the QC measurement results. Alternatively, an operator rather than the quality determination unit 16 may make a quality determination based on the reports shown in FIGS. 17 to 26. Furthermore, quality determination may be made for each lot processing rather than being made after all the lots are processed.

In accordance with the first embodiment of the invention, an intended lot, which is processed by the processing device 10 having variable device internal information, can be subjected to optimal dynamic sampling to intensively measure wafers and shot areas having high out-of-specification probability. This reduces loss due to missed defective lots.

Furthermore, for wafers having a QC prediction value falling under the specification region C, one wafer, for example, from among the wafers falling under the specification region C is selected for QC measurement, and thus QC measurement for all the wafers is not required. This reduces time and cost required for QC measurement. Note that more than one wafer may be selected for measurement as long as time and cost permits.

Moreover, the data storage device 2 can store QC actual measurements, device internal information corresponding thereto, and data of correlation between the QC actual measurements and the device internal information for wafers having a QC prediction value falling under the specification region C and thus regarded as non-defective. Using the within-wafer distribution of QC prediction values and the validation result of the recipe selection, the reliability of the system can be checked for each lot to increase the accuracy of dynamic sampling. This reduces yield decrease due to false dynamic sampling.

The sequence of procedure shown in FIG. 27 can be performed by causing a program having an algorithm equivalent to that shown in FIG. 27 to control the quality control system shown in FIG. 1. This program can be stored in a program storage device (not shown) of a computer system constituting the quality control system of the invention. Furthermore, this program can be stored in a computer-readable recording medium, which can be read by a program storage device of the quality control system for execution of the sequence of procedure of the embodiment of the invention. The term "computer-readable recording medium" used herein refers to a medium capable of recording programs such as an external memory device of a computer, semiconductor memory, magnetic disc, optical disc, magneto-optical disc, and magnetic tape, for example. In particular, the "computer-readable recording medium" includes a flexible disc, CD-ROM (Compact Disc Read Only Memory), MO (Magneto-Optical) disc, cassette tape, open-reel tape, and the like.

For example, the main body of the quality control system can be configured as being connected internally or externally to a media reading device such as a flexible disc drive and optical disc drive. A flexible disc or CD-ROM can be inserted into a loading slot of the flexible disc drive or optical disc drive, respectively, to install the program stored in the recording medium into the program storage device constituting the quality control system through a certain read operation. Furthermore, a certain drive unit can be connected to use a game pack ROM as a memory device or a cassette tape as a magnetic tape unit. Moreover, the program can also be stored in the program storage device through an information processing network such as the Internet.

Figure 28:
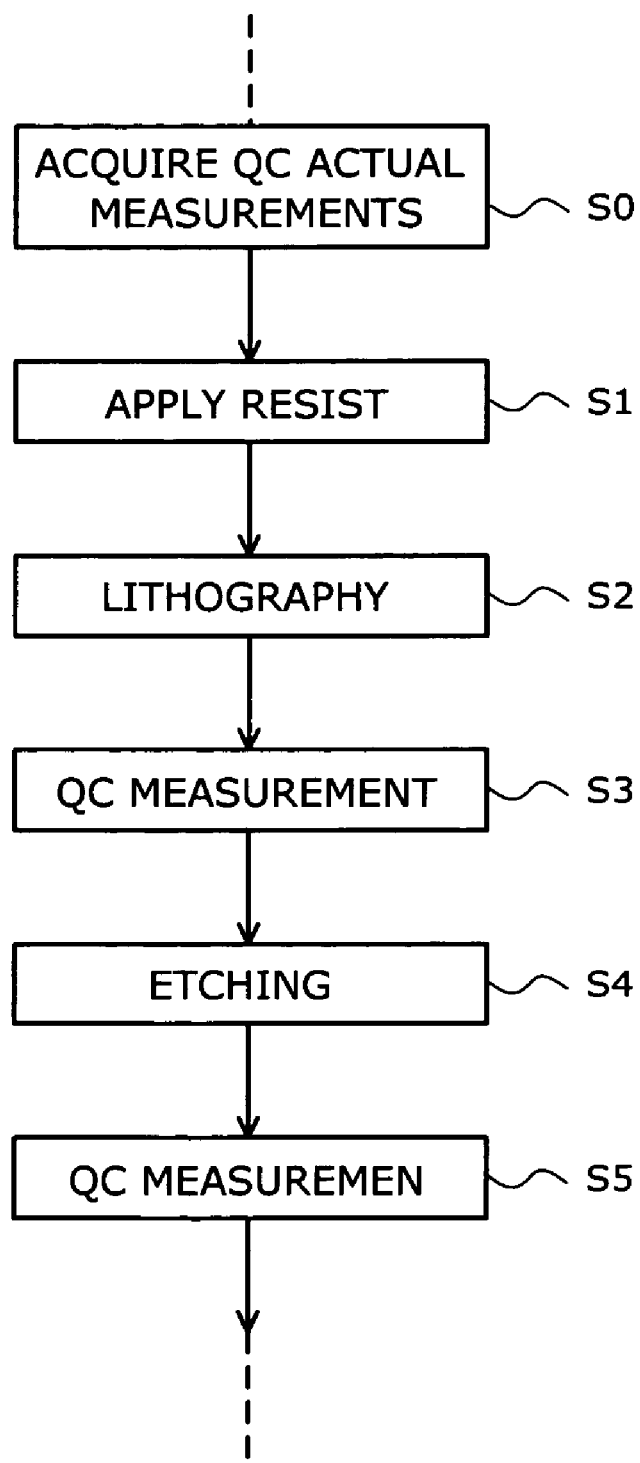
FIG. 28 is a flow chart for illustrating an example method of lot-to-lot wafer processing in accordance with the first embodiment of the invention.

Reference is now made to the flow chart of FIG. 28 to describe an example method of manufacturing a semiconductor device (method of lot-to-lot wafer processing) in accordance with the embodiment of the invention. Note that, while FIG. 28 illustrates only part of the manufacturing process, the actual manufacturing process involves many other steps not shown.

(1) First, in step S0, wafers in a first lot are processed using the processing device (e.g., RIE (Reactive Ion Etching) device) 10. Subsequently, QC measurement is made thereon, and the resulting QC actual measurements are stored in the QC value storage unit 22. Past QC actual measurements acquired earlier by QC measurement are accumulated in advance in the QC value storage unit 22.

(2) In step S1, for wafers in a second lot that is different from the first lot, resist coating is applied onto its etching material. In step S2, the resist coating is patterned using lithography to form a resist pattern 100 and the like as shown in FIG. 2. In step S3, using the measurement device 4 shown in FIG. 1, QC measurement is made to measure the line width Wr of the resist pattern 100 as a preliminary quality control measurement. The line width Wr of the resist pattern 100 is stored in the QC value storage unit 22 shown in FIG. 1.

(3) In step S4, for the wafers in the second lot, the patterned resist coating is used as a mask to etch the etching material by RIE using the processing device (RIE device) 10 shown in FIG. 1, thereby forming a finished pattern 101 and the like as shown in FIG. 2. At this time, the data acquisition device 3 acquires in real time the device internal information of the processing device (RIE device) 10 in the course of processing the second lot.

(4) In step S5, like the procedure of steps S130 to S180 shown in FIG. 27, a QC prediction value of the second lot is predicted using QC actual measurements for past lots including the second lot stored in the QC value storage unit 22 and the device internal information in processing the second lot. A sample wafer is determined using the QC prediction value. An application recipe to be applied to the sample wafer is selected from among a plurality of recipes in the recipe storage unit 24 using the QC prediction value. The application recipe is then used to measure the line width Wp of the finished pattern 101 of the sample wafer. The line width Wp of the finished pattern 101 is stored in the QC value storage unit 22. The pattern shift Wd between the line width Wp of the finished pattern 101 and the line width Wr of the resist pattern 100 is determined, and the quality of the second lot is determined using the pattern shift Wd.

The method of lot-to-lot wafer processing in accordance with the embodiment of the invention can reduce missed defective lots and can thereby increase the manufacturing yield of semiconductor devices.

SECOND EMBODIMENT

Figure 29:
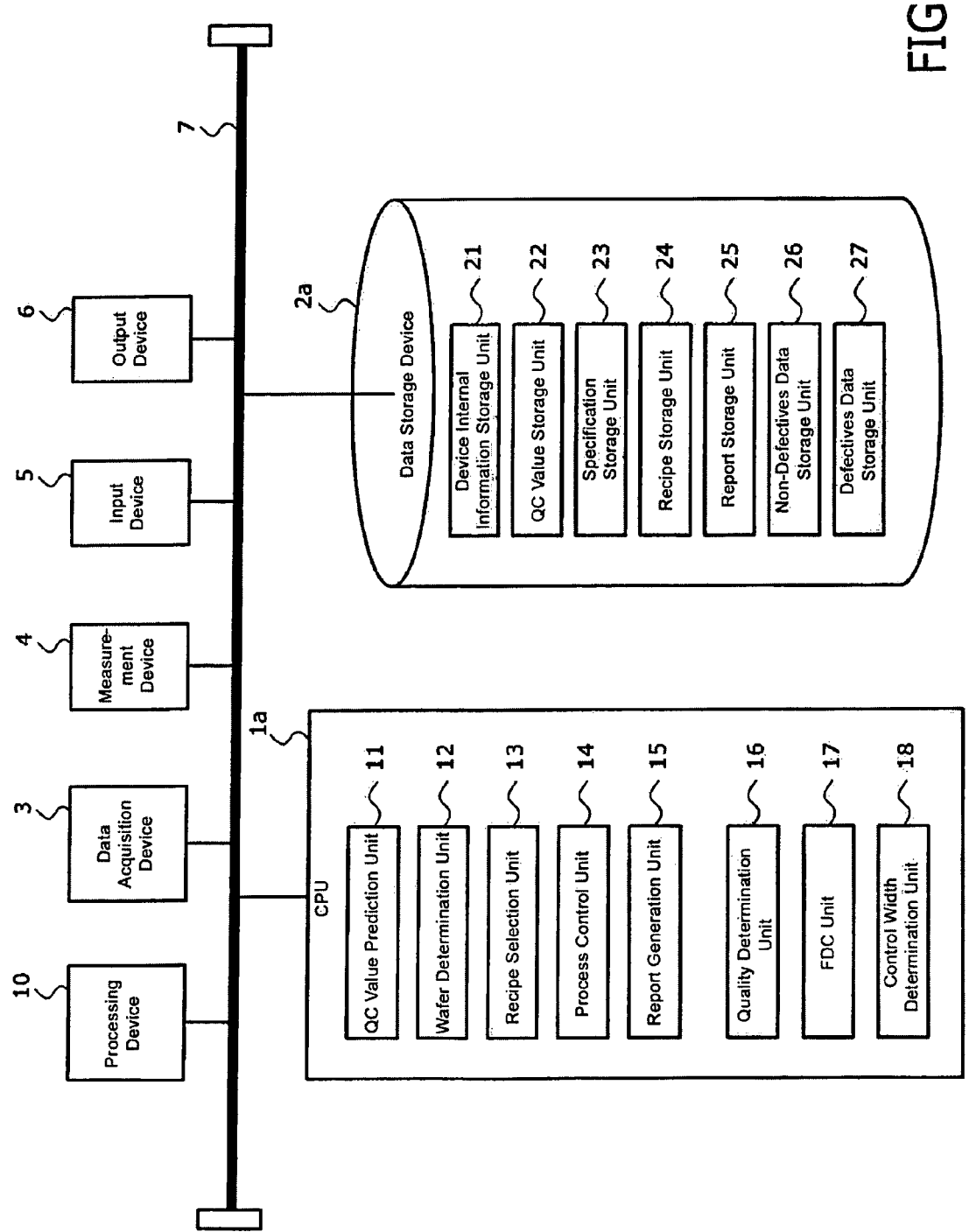
FIG. 29 is a block diagram showing an example quality control system in accordance with a second embodiment of the invention.

As shown in FIG. 29, the quality control system in accordance with the second embodiment of the invention is different from the quality control system shown in FIG. 1 in that the data storage device 2a further comprises a non-defectives data storage unit 26 and defectives data storage unit 27, and that the CPU 1a further comprises a control width determination unit 18.

The control width determination unit 18 determines a "control width" used in FDC and statistical process control (SPC). In "FDC", as in the FDC unit 17, the processing device 10 is continuously monitored while it processes wafers as part of the process of manufacturing semiconductor devices. Before any deviation of processing conditions in the processing device 10 adversely affects the product yield, the processing device 10 can be shut down to reduce risk on the wafers. In "SPC", an enormous amount of data collected at various checkpoints in the manufacturing process is used for statistical processing to monitor and control the progression (trend) of manufacturing conditions in each step and the progression (trend) of the quality of semiconductor devices. The "control width" is a threshold for determining the occurrence of abnormality in FDC and SPC, or for determining whether the quality is defective or non-defective. In FDC and SPC, the abnormality of the processing device 10 and of a process, and the quality of a lot, are determined according to whether the QC actual measurement of the lot is inside or outside the control width.

Out of the device internal information stored in the device internal information storage unit 21, the non-defectives data storage unit 26 stores the device internal information obtained when the QC actual measurement of a wafer is determined to be inside the control width (non-defectives data), and a predefined value for the number of non-defectives data that can be stored in the non-defectives data storage unit 26. Out of the device internal information stored in the device internal information storage unit 21, the defectives data storage unit 27 stores the device internal information obtained when the QC actual measurement of a wafer is determined to be outside the control width (defectives data), and a predefined value for the number of defectives data that can be stored in the defectives data storage unit 27.

Using non-defectives data stored in the non-defectives data storage unit 26 and defectives data stored in the defectives data storage unit 27, the control width determination unit 18 determines and updates the control width. In the following, a procedure of determining the control width is described. The average and standard deviation of all the non-defectives data stored in the non-defectives data storage unit 26, and the average and standard deviation of all the defectives data stored in the defectives data storage unit 27 are calculated. The Mahalanobis distance is then calculated for non-defectives data and for defectives data. A coefficient A is determined such that the following equation (1) holds:

$$A\sigma_G + A\sigma_{NG} = |X_{ANG} - X_{AG}| \qquad (1)$$

where $X_{AG}$ is the average of non-defectives data, $X_{ANG}$ the average of defectives data, $\sigma_G$ the standard deviation of non-defectives data, and $\sigma_{NG}$ the standard deviation of defectives data.

Figure 30:
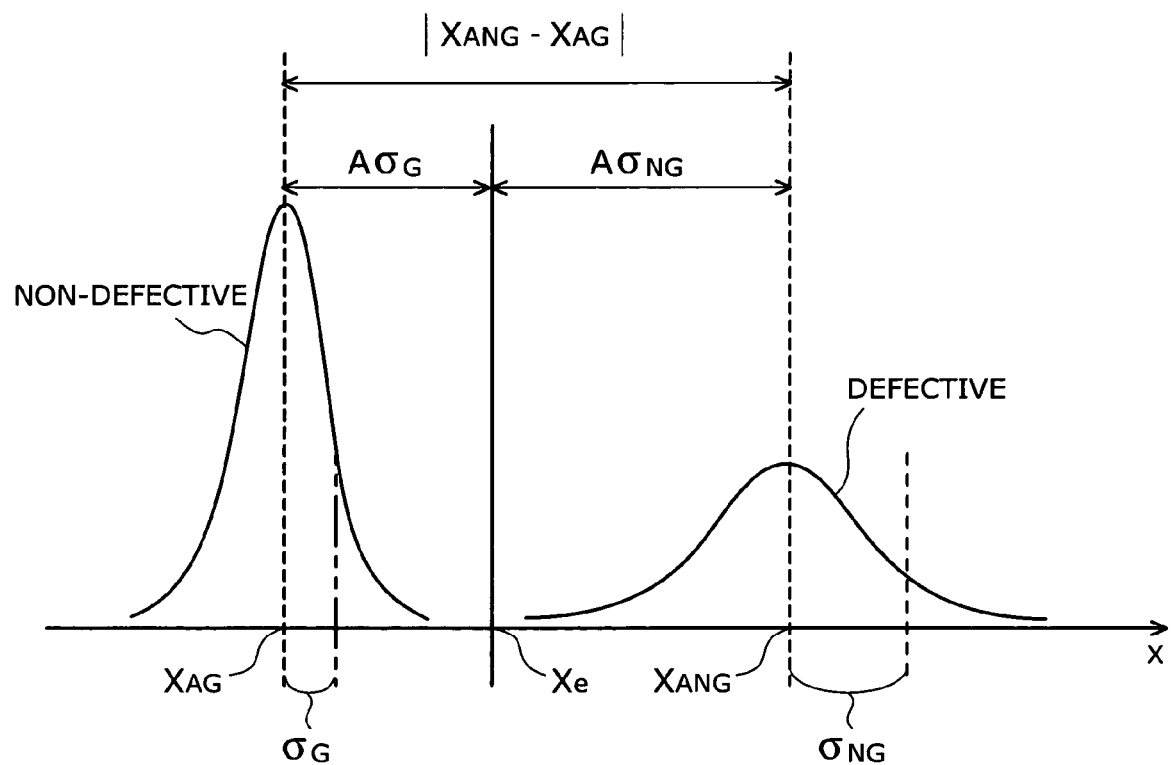
FIG. 30 is a graph for illustrating the Mahalanobis distance for univariate analysis in accordance with the second embodiment of the invention.
Figure 31:
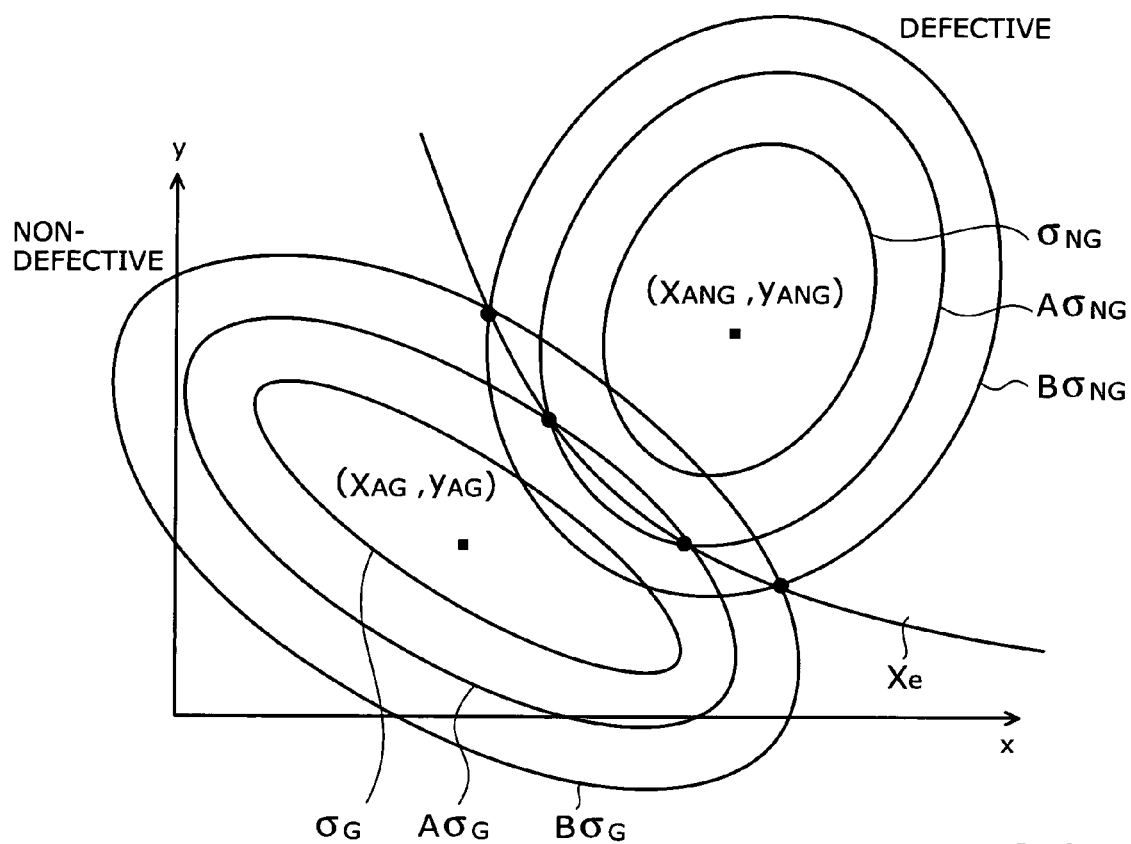
FIG. 31 is a graph for illustrating the Mahalanobis distance for multivariate analysis in accordance with the second embodiment of the invention.

FIG. 30 illustrates a situation in which defective and non-defectives data are univariate, and FIG. 31 illustrates a situation in which defective and non-defectives data are multivariate. As shown in FIGS. 30 and 31, the upper or lower threshold defining the control width is then determined to be a value Xe, for example, which represents the position of equal Mahalanobis distances for the control width, that is, the position spaced apart from the average $X_{AG}$ of non-defectives data toward the average $X_{ANG}$ of defectives data by $A\sigma_G$, or the position spaced apart from the average $X_{ANG}$ of defectives data toward the average $X_{AG}$ of non-defectives data by $A\sigma_{NG}$.

Figure 32:
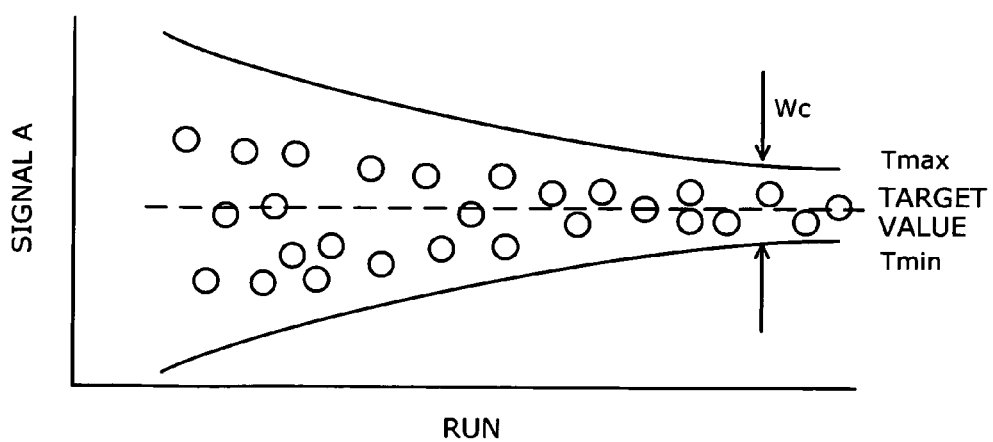
FIG. 32 is a graph for illustrating the trend of specifications in accordance with the second embodiment of the invention.

Alternatively, the control width determination unit 18 can also determine the control width solely from the non-defectives data. In this case, an average (moving average) $X_{AG}$ is determined from non-defectives data, and around this average $X_{AG}$, upper and lower thresholds defining the control width are determined to be two values obtained by adding or subtracting a times the standard deviation to or from $X_{AG}$, where a is an arbitrary number. That is, the control range is set to be from $\{X_{AG} - (\alpha \times \sigma)\}$ to $\{X_{AG} + (\alpha \times \sigma)\}$. The control width determination unit 18 causes the lot processing to proceed as shown in FIG. 32 and updates the control width Wc accordingly. The control width Wc tends to spread if it was relatively tight earlier, and tends to narrow if it was loose.

Figure 33:
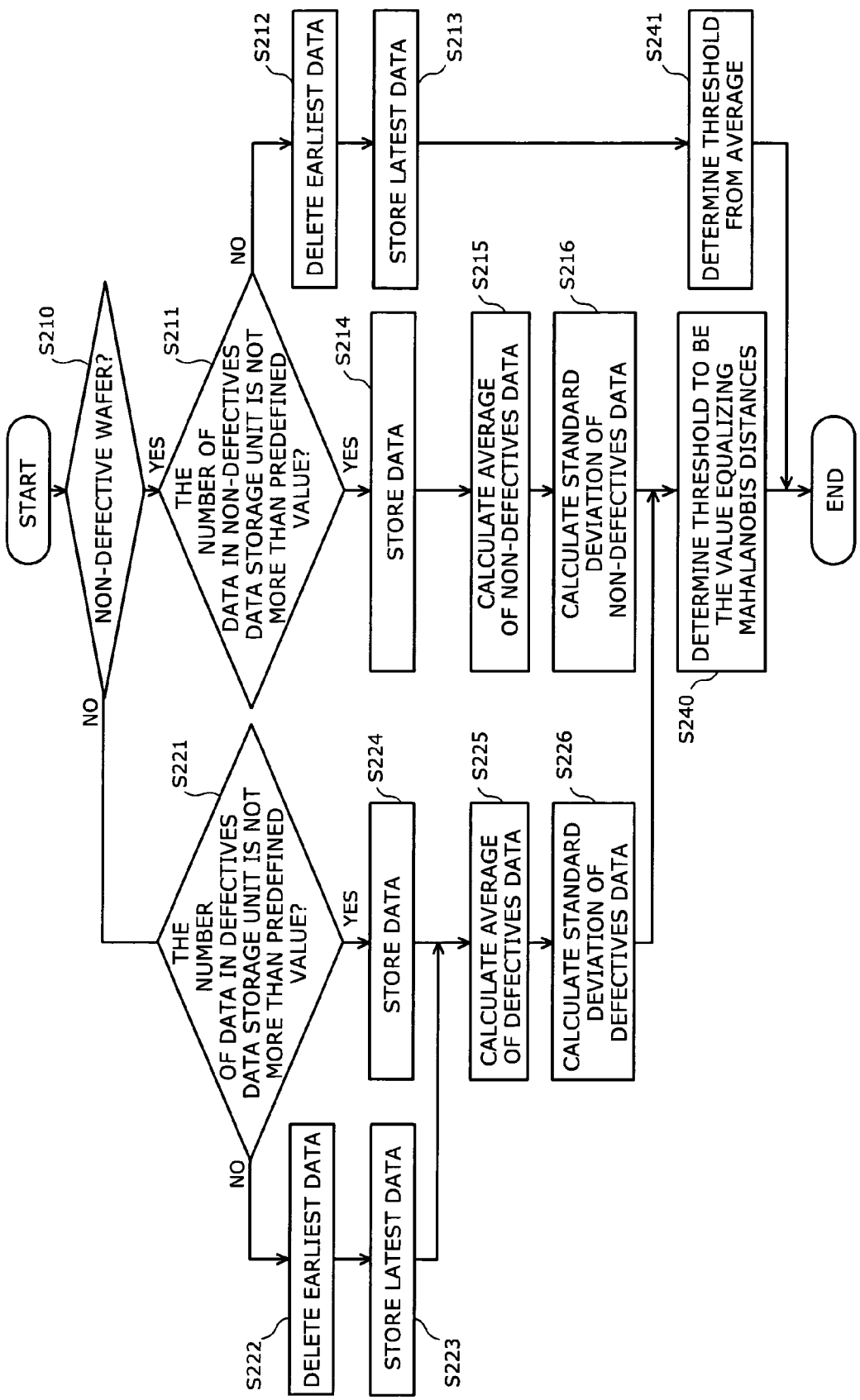
FIG. 33 is a flow chart for illustrating an example quality control method in accordance with the second embodiment of the invention.

Reference is now made to the flow chart of FIG. 33 to describe an example quality control method based on the quality control system shown in FIG. 29.

(1) In step S210, QC measurement is made like the procedure of steps S111 to S180 shown in FIG. 27. At this time, it is determined whether or not the QC actual measurement of a wafer is inside the control width of FDC or SPC, that is, whether the wafer is non-defective or defective. If the QC actual measurement is inside the control width, that is, if the wafer is non-defective, then the flow proceeds to step S211. Otherwise, if the QC actual measurement is outside the control width, that is, if the wafer is defective, then the flow proceeds to step 5221.

(2) In step S211, it is determined whether the number of data in the non-defectives data storage unit 26 is not more than a predefined number. If it is determined that the number of data exceeds the predefined number, then in step S212, the earliest data in the non-defectives data storage unit 26 is deleted. In step S213, the latest data is stored in the non-defectives data storage unit 26. In step S241, the average (moving average) of non-defectives data is calculated, and around this moving average, a control width is defined by upper and lower thresholds obtained by adding or subtracting a times the standard deviation σ (i.e., σ×α) to or from this average, where α is an arbitrary number.

(3) If it is determined that the number of data is not more than the predefined number in step S211, the flow proceeds to step S212, where the non-defectives data is directly stored in the non-defectives data storage unit 26. In step S215, the average of data stored in the non-defectives data storage unit 26 is calculated. In step S216, the standard deviation of data stored in the non-defectives data storage unit 26 is calculated.

(4) On the other hand, in step S221, it is determined whether the number of data in the defectives data storage unit 27 is not more than a predefined number. If it is determined that the number of data exceeds the predefined number, then in step S222, the earliest data in the defectives data storage unit 27 is deleted. In step S223, the latest data is stored in the defectives data storage unit 27. If it is determined that the number of data is not more than the predefined number in step S221, the flow proceeds to step S224, where the data is directly stored in the defectives data storage unit 27. In step S225, the average of data stored in the defectives data storage unit 27 is calculated. In step S226, the standard deviation of data stored in the defectives data storage unit 27 is calculated.

(5) In step S240, the position of equal Mahalanobis distances for the non-defectives data and for the defectives data is calculated as shown in FIGS. 30 and 31, and this position is used as an upper and lower threshold to define a control width. That is, the control width is determined to be centered at the average of non-defectives data and to have a width of twice the absolute value of the difference between the value equalizing the above-mentioned Mahalanobis distances and the average of non-defectives data. The earlier control width is replaced by the control width determined in steps S241 or S240, and the latest control width is used in the next iteration of FDC or SPC.

Conventionally, the control width for FDC and SPC is controlled as a fixed value. Unless it is directed to change the value, even an excessively loose or excessively tight control width remains to be used. This results in missed defectives, or false alarms in which non-defectives are mistaken for defectives, causing substantial loss. On the contrary, in accordance with the second embodiment of the invention, even when the status of the processing device 10 is varied, the control width can be automatically updated to an appropriate value by consistently using the latest device internal information, that is, by setting the control width to keep track of the variation of the device internal information. This allows for avoiding missed defective lots due to using an excessively loose control width and loss caused by scrapping normal lots due to using an excessively tight control width.

Furthermore, the Mahalanobis distance can be calculated using not only non-defectives data but also defectives data to determine the control width suited to the discrimination of defectives/non-defectives, thereby further reducing loss due to missed defectives and false alarms. While the position of equal Mahalanobis distances is determined to be a threshold for the control width, the threshold for the control width may be displaced from this position to the non-defectives data side or to the defectives data side.

OTHER EMBODIMENTS

The invention has been described with reference to the first and second embodiments. However, it is to be understood that the invention is not limited by the teachings and drawings that constitute part of this disclosure. Various alternatives, examples, and applications will be apparent to those skilled in the art in light of this disclosure. For example, while the first and second embodiments described above refer to classification into three specification regions A, B, and C as shown in FIG. 3, four or more regions can be used to select recipes in a more diverse manner. In the foregoing, the specification regions A and B are defined as a region not less than the value of 10% of the control width subtracted from the specification maximum and a region not more than the value of 10% of the control width added to the specification minimum, respectively. However, the boundary positions between the specification regions A to C are illustrative only and not limiting. Furthermore, while the within-wafer distributions are shown in FIGS. 4 to 9 in two dimensions, three-dimensional data can be used to select recipes in more detail. It is thus to be understood that the invention encompasses various embodiments that are not described herein. It is therefore intended that the invention is defined solely by the spirit and scope of the appended claims.

The invention claimed is:

1. A quality control system comprising:
a quality control value storage unit configured to store quality control actual measurements of past lots of wafers;
a data acquisition device configured to acquire device internal information of a processing device that processes an intended lot constituted of a plurality of wafers, the device internal information including a parameter of processing the intended lot;
a device internal information storage unit configured to store the device internal information;
a recipe storage unit configured to store a plurality of recipes, each recipe having a mutually different distribution of sampling density within a wafer;
a quality control value prediction unit configured to read the acquired device internal information from the device internal information storage unit, read the quality control actual measurements of past lots from the quality control value storage unit, and predict a quality control prediction value of the intended lot based on the acquired device internal information and the quality control actual measurements;
a wafer determination unit configured to determine a sample wafer to be measured from among the plurality of wafers constituting the intended lot based on the predicted quality control prediction value;
a recipe selection unit configured to read the plurality of recipes from the recipe storage unit and to select an application recipe to be applied to the sample wafer from among the plurality of recipes using the quality control prediction value; and
a measurement device configured to use the application recipe to make a quality control measurement on the sample wafer and to store a measurement result in the quality control value storage unit.

2. A quality control system according to claim 1, wherein the wafer determination unit determines the sample wafer to be a wafer having relatively high out-of-specification probability from among the plurality of wafers.

3. A quality control system according to claim 1, wherein the quality control prediction value of the intended lot includes one or more quality control prediction values for each of the plurality of wafers constituting the intended lot,
    further wherein, using a distribution of the quality control prediction values within the sample wafer, the recipe selection unit selects as the application recipe a recipe by which shot areas having relatively high out-of-specification probability are sampled at relatively high sampling density from among shot areas within the sample wafer.

4. A quality control system according to claim 1, wherein the quality control prediction value of the intended lot includes one or more quality control prediction values for each of the plurality of wafers constituting the intended lot,
    further wherein the wafer determination unit classifies the quality control prediction values of the wafers into a preferred region including a target value of the quality control prediction value, a high region higher than the preferred region, and a low region lower than the preferred region, and determines a wafer having a quality control prediction value belonging to the high region or low region to be the sample wafer.

5. A quality control system according to claim 4, wherein the recipe selection unit selects as the application recipe a recipe by which shot areas having relatively high quality control prediction values are sampled at relatively high sampling density from among the shot areas within the sample wafer when the quality control prediction value of the sample wafer belongs to the high region, and selects as the application recipe a recipe by which shot areas having relatively low quality control prediction values are sampled at relatively high sampling density from among the shot areas within the sample wafer when the quality control prediction value of the sample wafer belongs to the low region.

6. A quality control system according to claim 1, wherein the processing device is one device selected from the group consisting of an ion implantation device, impurity diffusion device, chemical vapor deposition device, reflow heat treatment device, densification heat treatment device, silicide formation device, sputtering device, vacuum evaporation device, plating device, chemical mechanical polishing device, dry etching device, wet etching device, cleaning device, spin coating device, exposure device, dicing device, and bonding device.

7. A quality control system according to claim 1, further comprising a control width determination unit configured to determine a control width that controls the quality control actual measurements based on the device internal information.

8. A quality control method comprising:
    acquiring device internal information of a processing device that processes an intended lot constituting a plurality of wafers, the device internal information including a parameter of processing the intended lot;
    predicting a quality control prediction value of the intended lot based on quality control actual measurements of past lots and the device internal information;
    determining a sample wafer to be measured from among the plurality of wafers constituting the intended lot based on the predicted quality control prediction value;
    selecting an application recipe to be applied to the sample wafer from among a plurality of recipes based on the predicted quality control prediction value, each recipe having a mutually different distribution of sampling density within the wafer; and
    using the application recipe to make a quality control measurement on the wafer to be measured and to store a measurement result.

9. A quality control method according to claim 8, wherein, in the determining a sample wafer, the sample wafer is determined to be a wafer having relatively high out-of-specification probability from among the plurality of wafers.

10. A quality control method according to claim 8, wherein predicting the quality control prediction value of the intended lot includes predicting one or more quality control prediction values for each of the plurality of wafers constituting the intended lot,
    further wherein, in the selecting an application recipe, using a distribution of the quality control prediction values within the sample wafer, a recipe by which shot areas having relatively high out-of-specification probability are sampled at relatively high sampling density from among shot areas within the sample wafer is selected as the application recipe.

11. A quality control method according to claim 8, wherein predicting the quality control prediction value of the intended lot includes predicting one or more quality control prediction values for each of the plurality of wafers constituting the intended lot,
    further wherein, in the determining a sample wafer, the quality control prediction values of the wafers are classified into a preferred region including a target value of the quality control prediction value, a high region higher than the preferred region, and a low region lower than the preferred region, and a wafer having a quality control prediction value belonging to the high region or low region is determined to be the sample wafer.

12. A quality control method according to claim 11, wherein, in the selecting an application recipe, a recipe by which shot areas having relatively high quality control prediction values are sampled at relatively high sampling density from among the shot areas within the sample wafer is selected as the application recipe when the quality control prediction value of the sample wafer belongs to the high region, and a recipe by which shot areas having relatively low quality control prediction values are sampled at relatively high sampling density from among the shot areas within the sample wafer is selected as the application recipe when the quality control prediction value of the sample wafer belongs to the low region.

13. A quality control method according to claim 8, further comprising determining a control width that controls the quality control actual measurements based on the device internal information.

14. A method of lot-to-lot wafer processing comprising:
    processing a first lot of wafers by a processing device and storing a quality control actual measurement thereof;
    processing a second lot constituting a plurality of wafers by the processing device;
    acquiring device internal information of the processing device in the processing of the second lot, the device internal information including a parameter of processing the second lot;
    predicting a quality control prediction value of the second lot using the acquired device internal information in the processing of the second lot and quality control actual measurements of past lots;
    determining a sample wafer to be measured from among the plurality of wafers constituting the second lot based on the predicted quality control prediction value;
    selecting an application recipe to be applied to the sample wafer from among a plurality of recipes based on the predicted quality control prediction value, each recipe having a mutually different distribution of sampling density within the sample wafer;

using the application recipe to make a quality control measurement on the sample wafer; and determining quality of the second lot based on a result of the quality control measurement.

15. A method of lot-to-lot wafer processing according to claim 14, wherein the act of processing a second lot comprises:

performing a preliminary process on every wafer constituting the second lot;

making a preliminary quality control measurement on the every wafer; and performing an actual process on the every wafer, and the act of predicting a quality control prediction value of the second lot comprises:

predicting the quality control prediction value of the second lot using quality control actual measurements of the first lot and earlier lots and a result of the preliminary quality control measurement.

16. A method of lot-to-lot wafer processing according to claim 14, wherein, in the determining a sample wafer, the sample wafer is determined to be a wafer having relatively high out-of-specification probability from among the plurality of wafers.

17. A method of lot-to-lot wafer processing according to claim 14, wherein predicting the quality control prediction value of the second lot includes predicting one or more quality control prediction values for each of the plurality of wafers constituting the second lot, further wherein, in the selecting an application recipe, using a distribution of the quality control prediction values within the sample wafer, a recipe by which shot areas having relatively high out-of-specification probability are sampled at relatively high sampling density from among shot areas within the sample wafer is selected as the application recipe.

18. A method of lot-to-lot wafer processing according to claim 14, wherein predicting the quality control prediction value of the second lot includes predicting one or more quality control prediction values for each of the plurality of wafers constituting the second lot, further wherein, in the determining a sample wafer, the quality control prediction values of wafers are classified into a preferred region including a target value of the quality control prediction value, a high region higher than the preferred region, and a low region lower than the preferred region, and a wafer having a quality control prediction value belonging to the high region or low region is determined to be the sample wafer.

19. A method of lot-to-lot wafer processing according to claim 18, wherein, in the selecting an application recipe, a recipe by which shot areas having relatively high quality control prediction values are sampled at relatively high sampling density from among shot areas within the sample wafer is selected as the application recipe when the quality control prediction value of the sample wafer belongs to the high region, and a recipe by which shot areas having relatively low quality control prediction values are sampled at relatively high sampling density from among the shot areas within the sample wafer is selected as the application recipe when the quality control prediction value of the sample wafer belongs to the low region.

20. A method of lot-to-lot wafer processing according to claim 14, further comprising determining a control width that controls the quality control actual measurements based on the device internal information.

* * * * *